(12) United States Patent
Tomita

(10) Patent No.: US 6,501,309 B1
(45) Date of Patent: *Dec. 31, 2002

(54) SEMICONDUCTOR DEVICE HAVING TIMING STABILIZATION CIRCUIT WITH OVERFLOW DETECTION FUNCTION

(75) Inventor: Hiroyoshi Tomita, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 59 days.

(21) Appl. No.: 09/109,900

(22) Filed: Jul. 2, 1998

(30) Foreign Application Priority Data

Nov. 7, 1997 (JP) .............................. 9-305938

(51) Int. Cl.$^7$ ................................. H03L 7/08
(52) U.S. Cl. ....................... 327/158; 327/149; 327/161; 375/376
(58) Field of Search ................................ 327/141, 144, 327/146, 147, 149, 150, 152, 153, 155, 156, 158, 159, 161, 233, 236, 261, 269; 331/DIG. 2, 1 A; 375/373–376

(56) References Cited

U.S. PATENT DOCUMENTS

| | | | | |
|---|---|---|---|---|
| 5,049,766 A | * | 9/1991 | Driest et al. ................. | 327/269 |
| 5,451,894 A | * | 9/1995 | Guo ............................ | 327/241 |
| 5,497,263 A | * | 3/1996 | Masuda et al. ............. | 327/278 |
| 5,939,913 A | * | 8/1999 | Tomita ....................... | 327/158 |

FOREIGN PATENT DOCUMENTS

| | | |
|---|---|---|
| KR | 97-31307 | 6/1997 |
| KR | 97-60706 | 8/1997 |

* cited by examiner

Primary Examiner—Timothy P. Callahan
Assistant Examiner—Minh Nguyen
(74) Attorney, Agent, or Firm—Arent Fox Kintner Plotkin & Kahn

(57) ABSTRACT

A semiconductor device includes an input buffer buffering an external clock signal to supply an internal clock signal. The semiconductor device further includes a timing-stabilization circuit which generates a plurality of phase-adjusted clock signals by adjusting delays of a plurality of variable-delay circuits as the plurality of variable-delay circuits delay the internal clock signal, and an overflow-detection circuit which detects overflow when at least one of the plurality of variable-delay circuits has a delay set to an upper end of an adjustable delay range.

14 Claims, 18 Drawing Sheets

SEMICONDUCTOR DEVICE HAVING TIMING STABILIZATION CIRCUIT WITH OVERFLOW DETECTION FUNCTION

BACKGROUND OF THE INVENTION

1. Field of the Invention

The present invention generally relates to semiconductor devices, and particularly relates to a semiconductor device equipped with a timing-stabilization circuit such as a DLL (delay-locked loop) circuit.

2. Description of the Related Art

FIG. 1 is a block diagram of a configuration in which a DLL circuit is used as a timing-stabilization circuit for data-input operations.

The configuration of FIG. 1 includes an input buffer 501, a variable-delay circuit 502, a clock-control circuit 503, an input circuit 504, a frequency divider 505, a phase comparator 506, a delay-control circuit 507, a variable-delay circuit 508, a dummy-input circuit 509, a dummy-input buffer 510, and a lock-on detector 511.

A clock signal CLK input to the input buffer 501 is compared with a reference-voltage level Vref, and is output as an internal-clock signal i-clk from the input buffer 501. The internal-clock signal i-clk is delayed by the variable-delay circuit 502 by an appropriate delay amount, and is supplied to the input circuit 504 via the clock-control circuit 503. The input circuit 504 uses the internal-clock signal i-clk as a synchronization signal to latch input data. The latched input data is then supplied from the input circuit 504 to internal circuits of the semiconductor device.

The signal path from the input of the clock signal CLK to the input circuit 504 inevitably introduces a delay which is inherent to the circuit, so that the input data supplied from the input circuit 504 to the internal circuits has a timing displacement relative to the input clock signal CLK. In order to ensure that the input data supplied to the internal circuits is adjusted to have a predetermined timing relation with the clock signal CLK supplied from an external source, a DLL circuit mainly comprised of the phase comparator 506, the delay-control circuit 507, and the variable-delay circuit 508 is employed.

The internal-clock signal i-clk is subjected to frequency division in the frequency divider 505 to generate a dummy-clock signal d-clk and a reference-clock signal c-clk. The dummy-clock signal d-clk is supplied to the variable-delay circuit 508. The variable-delay circuit 508 is controlled to delay the dummy-clock signal d-clk by the same delay amount as that applied by the variable-delay circuit 502. The dummy-clock signal d-clk delayed by the variable-delay circuit 508 is then supplied to the phase comparator 506 via the dummy-input circuit 509 and the dummy-input buffer 510. Here, the dummy-input circuit 509 has the same delay characteristics as the input circuit 504, and the dummy-input buffer 510 has the same delay characteristics as the input buffer 501.

The phase comparator 506 makes a comparison of the reference-clock signal c-clk with the clock signal supplied from the dummy-input buffer 510. To ensure that both clock signals have the same phase, the phase comparator 506 controls the delay amount of the variable-delay circuit 508 via the delay-control circuit 507. In this manner, the clock signal supplied from the dummy-input circuit 509 is adjusted so as to have a predetermined timing relation with the input clock signal CLK.

When the clock-control circuit 503 is ignored, a total delay of the input buffer 501, the variable-delay circuit 502, and the input circuit 504 is equal to a total delay of the dummy-input buffer 510, the variable-delay circuit 508, and the dummy-input circuit 509. Because of this, the input data supplied from the input circuit 504 ends up having the predetermined timing relation with the input clock signal CLK.

In this configuration, even when the characteristics of the input buffer 501, the variable-delay circuit 502, and the input circuit 504 are changed due to variations in a power voltage and/or temperature, the characteristics of the dummy-input buffer 510, the variable-delay circuit 508, and the dummy-input circuit 509 also change in the same manner. Because of this, the input data supplied from the input circuit 504 to the internal circuits always keeps the same timing relation with the input clock signal CLK regardless of a power-voltage variation and/or a temperature variation.

The lock-on detector 511 checks whether the DLL circuits has locked on, based on signals supplied from the phase comparator 506. That is, the lock-on detector 511 checks whether the two clock signals subjected to phase comparison by the phase comparator 506 have the same phase. When a lock-on condition is established, the lock-on detector 511 controls the frequency divider 505 to lower the frequency of the dummy-clock signal d-clk and the reference-clock signal c-clk, thereby reducing power consumption.

The delay-control circuit 507, when set to a maximum delay amount, outputs an overflow signal. Each of the variable-delay circuits 502 and 508 is comprised of a predetermined number of delay elements arranged in series, and is controlled by the delay-control circuit 507. Because of this configuration, the number of usable delay elements is limited in nature. If the delay amount is set to a possible maximum amount, the variable-delay circuits 502 and 508 cannot further increase the delay. In this case, the overflow signal indicating detection of overflow is supplied to the clock-control circuit 503. When overflow is detected, the clock-control circuit 503 selects the internal-clock signal i-clk bypassing the variable-delay circuit 502 rather than selecting the clock signal supplied from the variable-delay circuit 502, and supplies the internal-clock signal i-clk to the input circuit 504.

Clock stabilization using the DLL circuit as described above is employed with respect to not only an input portion of the semiconductor device but also an output portion thereof. In such a case, data-output operations can be conducted at predetermined stable timings.

The configuration of FIG. 1 has a drawback in that overflow cannot be detected outside the semiconductor device. During a test of the semiconductor device, therefore, it is impossible to know whether data is input by using the internal-clock signal i-clk delayed by the variable-delay circuit 502 or by using the internal-clock signal i-clk bypassing the variable-delay circuit 502. This prevents an appropriate test from being carried out in an attempt to learn characteristics of the semiconductor device.

Further, the configuration of FIG. 1 does not take into consideration how to detect overflow when the variable-delay circuits are comprised of a rough-delay circuit and a fine-delay circuit arranged in series or when a plurality of internal clocks are used in the semiconductor device.

Moreover, the configuration of FIG. 1 continues to supply the internal-clock signal i-clk to the variable-delay circuit 502 and to supply the dummy-clock signal d-clk to the variable-delay circuit 508 even after overflow is detected. As previously described, upon detection of overflow, the internal-clock signal i-clk which bypasses the variable-delay circuit 502 will be used as a synchronization signal for the data input. In this case, the delay control by the variable-delay circuit 502 is irrelevant to the operations of the semiconductor device. There is no need, therefore, to supply the internal-clock signal i-clk to the variable-delay circuit 502. Also, there is no need to supply the dummy-clock signal d-clk to the variable-delay circuit 508 such that control of the dummy-clock signal d-clk is carried out at relatively short intervals by the variable-delay circuit 508. Sustained supply of the internal-clock signal i-clk to the variable-delay circuit 502 and of the dummy-clock signal d-clk having a relatively high frequency to the variable-delay circuit 508 results in excessive power consumption.

Accordingly, there is a need for a semiconductor device which allows overflow of a variable-delay circuit in a DLL circuit to be detected outside the semiconductor device.

Also, there is a need for a semiconductor device which detects overflow of variable-delay circuits in DLL circuits when a plurality of internal clocks are used or when a variable-delay circuit is comprised of two stages connected in series.

Further, there is a need for a semiconductor device which can reduce power consumption in a DLL circuit when overflow is detected in a variable-delay circuit of the DLL circuit.

SUMMARY OF THE INVENTION

Accordingly, it is a general object of the present invention to provide a semiconductor device which can satisfy the needs described above.

It is another and more specific object of the present invention to provide a semiconductor device which allows overflow of a variable-delay circuit in a DLL circuit to be detected outside the semiconductor device.

It is still another object of the present invention to provide a semiconductor device which detects overflow of variable-delay circuits in DLL circuits when a plurality of internal clocks are used or when a variable-delay circuit is comprised of two stages connected in series.

It is yet another object of the present invention to provide a semiconductor device which can reduce power consumption in a DLL circuit when overflow is detected in a variable-delay circuit of the DLL circuit.

A semiconductor device according to the present invention includes an input buffer buffering an external clock signal to supply an internal clock signal, a timing-stabilization circuit which generates a plurality of phase-adjusted clock signals by adjusting delays of a plurality of variable-delay circuits as the plurality of variable-delay circuits delay the internal clock signal, and an overflow-detection circuit which detects overflow when at least one of the plurality of variable-delay circuits has a delay set to an upper end of an adjustable delay range.

The semiconductor device described above has the timing-stabilization circuit which generates the plurality of phase-adjusted clock signals, where overflow is detected when a delay is set to the upper end of the adjustable delay range in at least one of the variable-delay circuits. An appropriate detection of overflow can thus be made even when the plurality of phase-adjusted clock signals are used.

According to one aspect of the present invention, the overflow is detected at an instance when the delay is set to the upper end or at an instance when the delay is attempted to be increased from the upper end, so that an appropriate overflow detection is achieved.

According to another aspect of the present invention, an overflow-detection signal is output to an exterior of the semiconductor device, so that a check can be made outside the semiconductor device as to whether overflow is present.

According to another aspect of the present invention, a frequency divider is used in the timing-stabilization circuit, and lowers a frequency of frequency-divided clock signals when overflow is detected, thereby suppressing power consumption in the timing-stabilization circuit.

According to another aspect of the present invention, supply of the internal clock signal to the variable-delay circuits is stopped when overflow is detected, thereby avoiding unnecessary power consumption in the variable-delay circuits.

According to another aspect of the present invention, when overflow is detected, the internal clock signal or an inverse of the internal clock signal is supplied to internal circuits as substitutes for the phase-adjusted clock signals serving as synchronization signals in the internal circuits. When a latch is provided as one of the internal circuits, for example, the latch can latch data while securing a sufficient data-hold time.

According to another aspect of the present invention, a semiconductor device includes an input buffer buffering an external clock signal to supply an internal clock signal, a timing-stabilization circuit which generates a phase-adjusted clock signal by adjusting a delay of a variable-delay circuit as the variable-delay circuit delays the internal clock signal, an overflow-detection circuit which generates an overflow-detection signal when the delay of the variable-delay circuit is set to an upper end of an adjustable delay range, and an output circuit which outputs the overflow-detection signal to an exterior of the semiconductor device.

The semiconductor device described above allows the overflow-detection signal to be output to the exterior of the semiconductor device, thereby making it possible to check outside the device as to whether overflow is present.

According to another aspect of the present invention, a semiconductor device includes an input buffer buffering an external clock signal to supply an internal clock signal, a timing-stabilization circuit which generates a phase-adjusted clock signal by adjusting a delay of a variable-delay circuit as the variable-delay circuit delays the internal clock signal, and an overflow-detection circuit which detects overflow when the delay of the variable-delay circuit is set to an upper end of an adjustable delay range, wherein the timing-stabilization circuit includes a feedback loop for controlling the delay of the variable-delay circuit, and a frequency divider which divides a frequency of the internal clock signal to generate a frequency-divided clock signal used in the feedback loop, wherein the frequency divider lowers a frequency of the frequency-divided clock signal when the overflow-detection circuit detects overflow.

In the semiconductor device described above, the frequency divider of the timing-stabilization circuit lowers the frequency of the frequency-divided clock signals when overflow is detected, thereby suppressing power consumption in the timing-stabilization circuit.

According to another aspect of the present invention, a semiconductor device includes an input buffer buffering an external clock signal to supply an internal clock signal, a timing-stabilization circuit which generates a phase-adjusted clock signal by adjusting a delay of a variable-delay circuit as the variable-delay circuit delays the internal clock signal, an overflow-detection circuit which detects overflow when the delay of the variable-delay circuit is set to an upper end of an adjustable delay range, and a circuit which stops supply of the internal clock circuit to the variable-delay circuit when the overflow-detection circuit detects overflow.

In the semiconductor device described above, supply of the internal clock signal to the variable-delay circuit is stopped when overflow is detected, thereby avoiding unnecessary power consumption in the variable-delay circuits.

According to another aspect of the present invention, a semiconductor device includes an input buffer buffering an external clock signal to supply an internal clock signal, a timing-stabilization circuit which generates a phase-adjusted clock signal by adjusting a delay of a rough-adjustment variable-delay circuit and a delay of a fine-adjustment variable-delay circuit as the rough-adjustment variable-delay circuit and the fine-adjustment variable-delay circuit delay the internal clock signal, and an overflow-detection circuit which detects overflow when the delay of the rough-adjustment variable-delay circuit is set to an upper end of an adjustable delay range.

In the semiconductor device described above, a delay adjustment is made by the rough-adjustment variable-delay circuit and the fine-adjustment variable-delay circuit in the timing-stabilization circuit, wherein overflow is detected when a delay of the rough-adjustment variable-delay circuit is set to the upper end of the adjustable delay range. An appropriate detection of overflow thus can be made.

According to another aspect of the present invention, a semiconductor device includes an input buffer buffering an external clock signal to supply an internal clock signal, a timing-stabilization circuit which generates a phase-adjusted clock signal by adjusting a delay of a variable-delay circuit as the variable-delay circuit delays the internal clock signal, an overflow-detection circuit which detects overflow when the delay of the variable-delay circuit is set to an upper end of an adjustable delay range, a selection circuit which supplies one of the internal clock signal and an inverse of the internal clock signal to an internal circuit as a substitute for the phase-adjusted clock signal serving as a synchronization signal in the internal circuit when the overflow-detection circuit detects overflow, and a control circuit which can override operations of the selection circuit based on at least one externally provided signal such that the at least one externally provided signal determines which clock signal is selected by the selection circuit regardless of whether the overflow-detection circuit detects overflow.

The semiconductor device described above is structured such that the internal clock signal or an inverse of the internal clock signal is selected as a synchronization signal in place of the phase-adjusted clock signal when overflow is detected, yet has the control circuit which can control the selection of the synchronization signal regardless of whether overflow is present. This configuration allows the semiconductor device to operate in synchronism with the phase-adjusted clock signal irrespective of presence of overflow and to undergo an operation test under this condition.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 2:
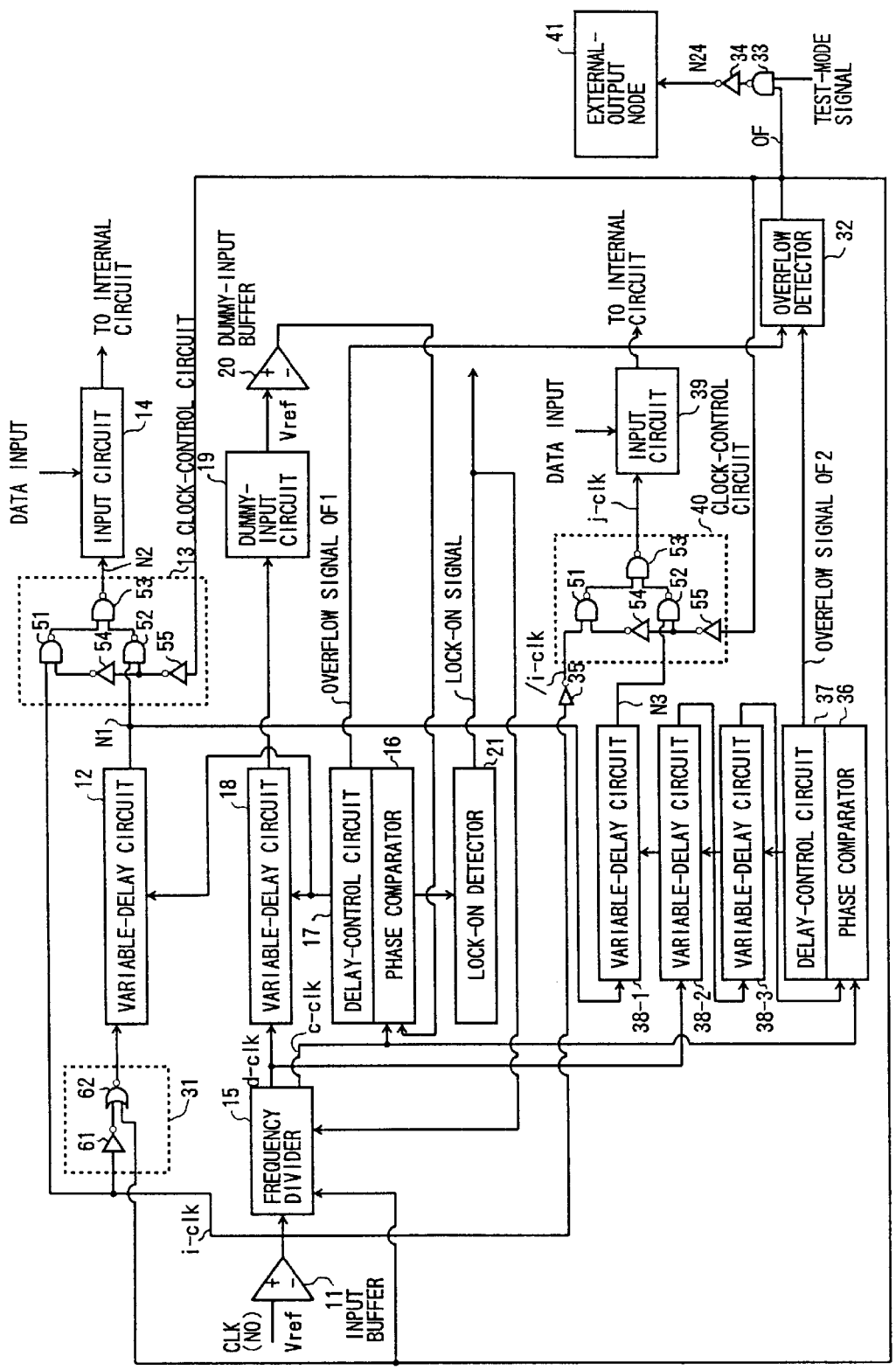
FIG. 2 is a block diagram of a first embodiment of a timing stabilization circuit according to the present invention.
Figure 3:
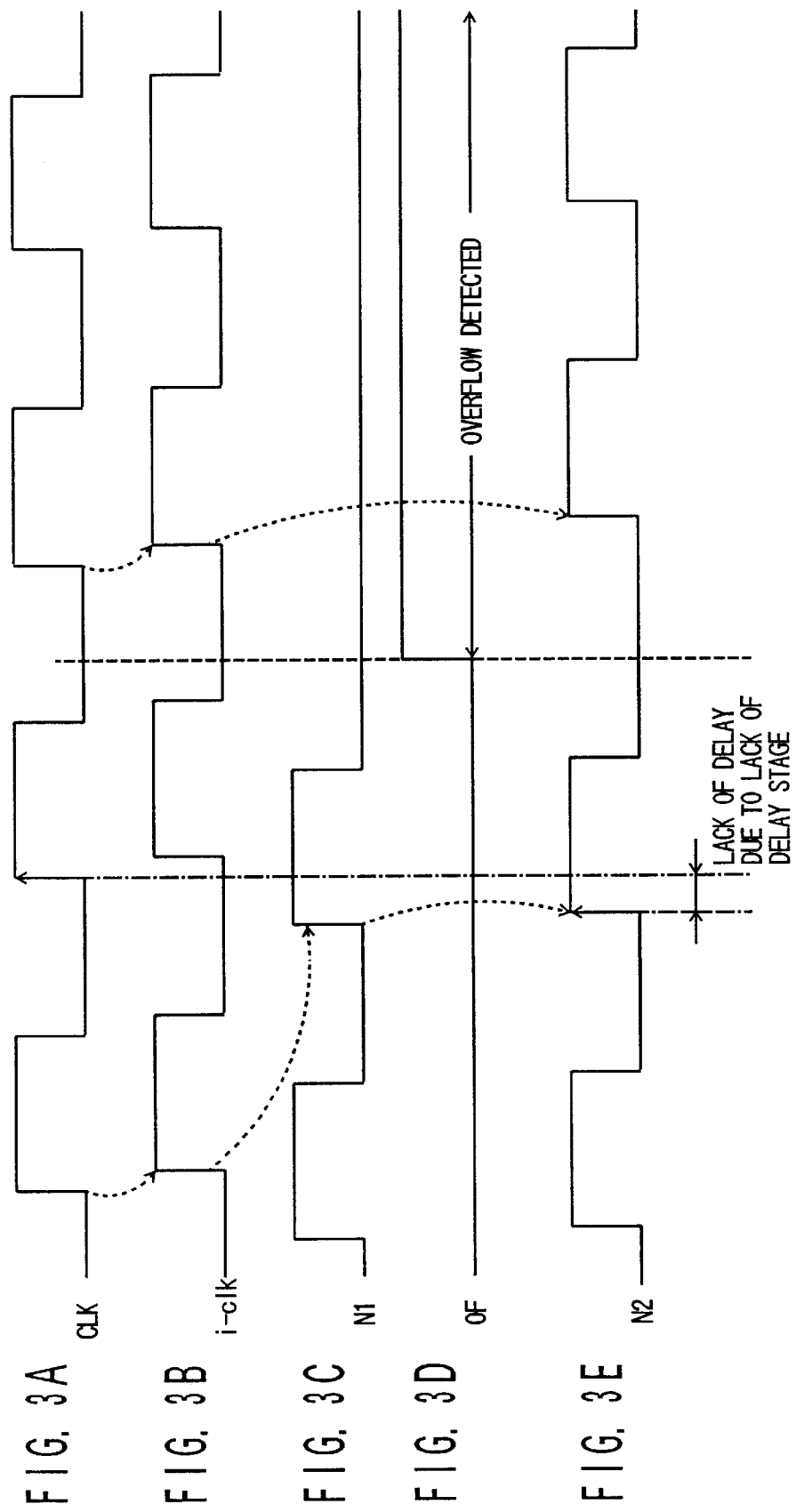
FIGS. 3A through 3E are timing charts for explaining operations of a clock-control circuit of FIG. 2.
Figure 4:
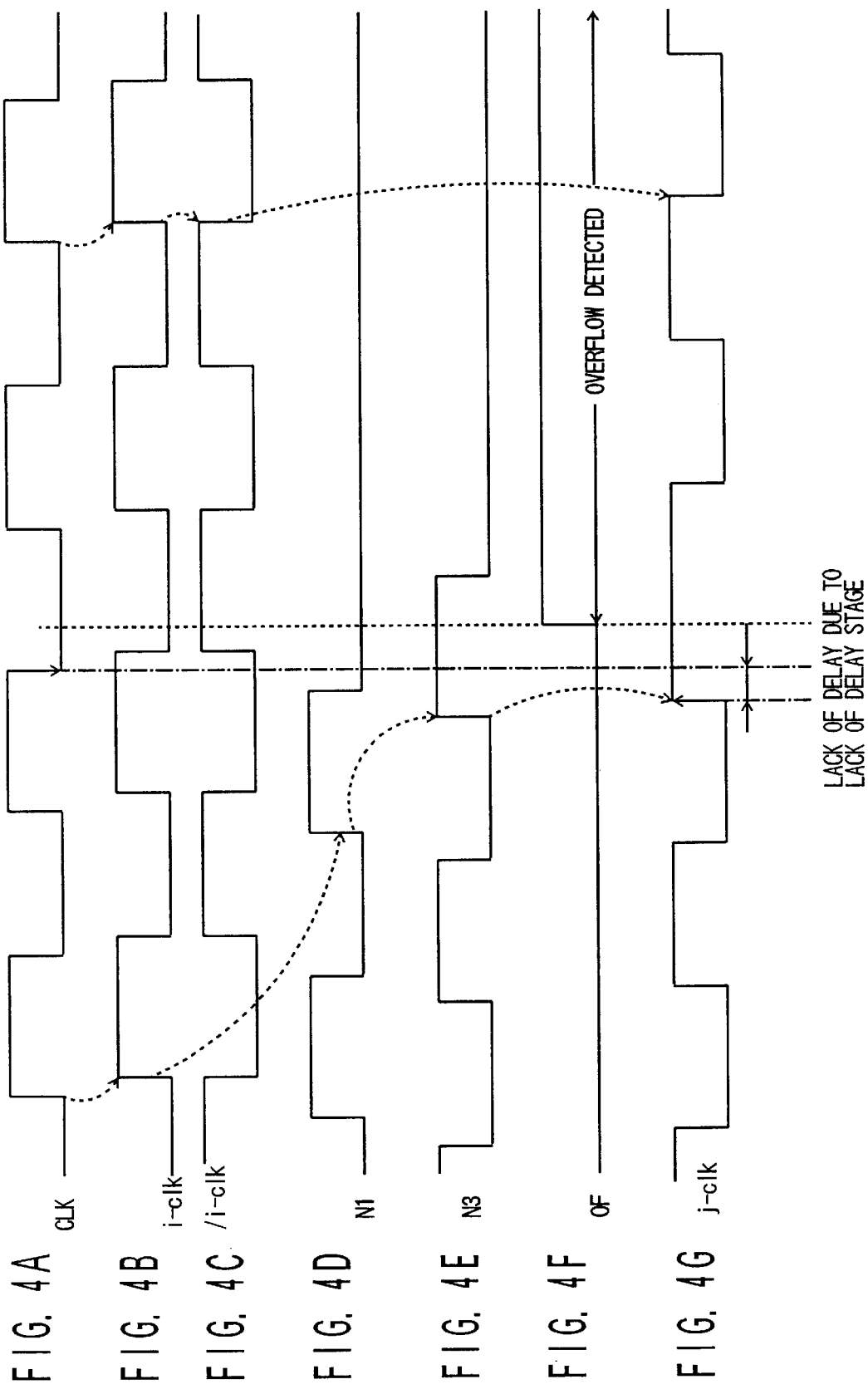
FIGS. 4A through 4G are timing charts for explaining operations of the clock-control circuit.

FIG. 2 is a block diagram of a first embodiment of a timing stabilization circuit according to the present invention.

Figure 1:
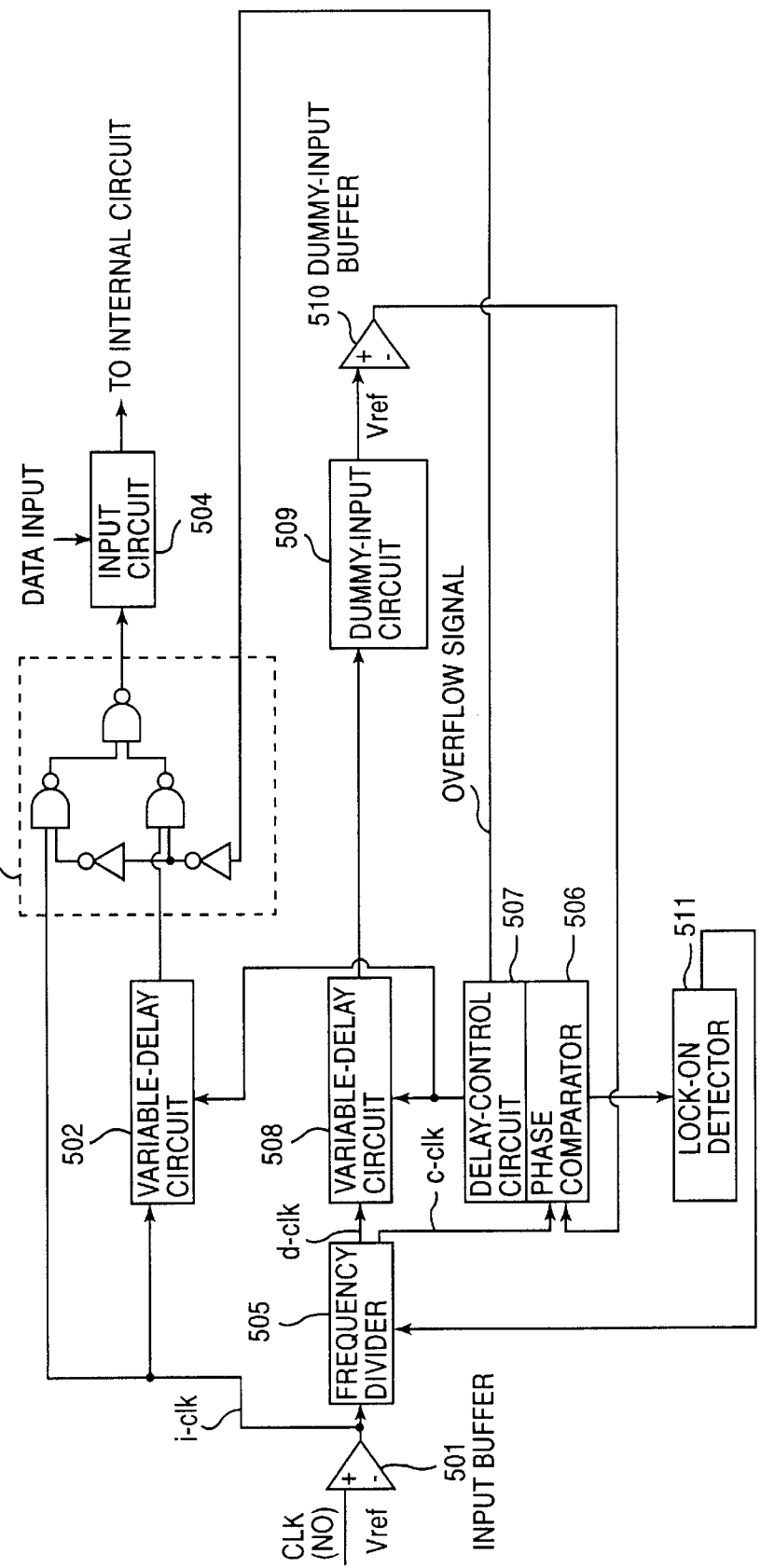
FIG. 1 is a block diagram of a prior art configuration in which a DLL circuit is used as a timing-stabilization circuit for data-input operations.

The timing-stabilization circuit of FIG. 2 includes an input buffer 11, a variable-delay circuit 12, a clock-control circuit 13, an input circuit 14, a frequency divider 15, a phase comparator 16, a delay-control circuit 17, a variable-delay circuit 18, a dummy-input circuit 19, a dummy-input buffer 20, and a lock-on detector 21. These elements serve to provide the same functions as the input buffer 501, the variable-delay circuit 502, the clock-control circuit 503, the input circuit 504, the frequency divider 505, the phase comparator 506, the delay-control circuit 507, the variable-delay circuit 508, the dummy-input circuit 509, the dummy-input buffer 20, and the lock-on detector 21 shown in FIG. 1.

A clock signal CLK input to the input buffer 11 is compared with a reference-voltage level Vref, and is output as an internal-clock signal i-clk from the input buffer 11. The internal-clock signal i-clk is delayed by the variable-delay circuit 12 by an appropriate delay amount, and is supplied to the input circuit 14 via the clock-control circuit 13. The input circuit 14 uses the internal-clock signal i-clk as a synchronization signal to latch input data. The latched input data is then supplied from the input circuit 14 to internal circuits of the semiconductor device.

The signal path from the input of the clock signal CLK to the input circuit 14 inevitably introduces a delay which is inherent to the circuit, so that the input data supplied from the input circuit 14 to the internal circuits has a timing displacement relative to the input clock signal CLK. In order to ensure that the input data supplied to the internal circuits is adjusted to have a predetermined timing relation with the clock signal CLK supplied from an external source, a DLL circuit mainly comprised of the phase comparator 16, the delay-control circuit 17, and the variable-delay circuit 18 is employed.

The internal-clock signal i-clk is subjected to frequency division in the frequency divider 15 to generate a dummy-clock signal d-clk and a reference-clock signal c-clk. The dummy-clock signal d-clk is supplied to the variable-delay circuit 18. The variable-delay circuit 18 is controlled to delay the dummy-clock signal d-clk by the same delay amount as that applied by the variable-delay circuit 12. The dummy-clock signal d-clk delayed by the variable-delay circuit 18 is then supplied to the phase comparator 16 via the dummy-input circuit 19 and the dummy-input buffer 20. Here, the dummy-input circuit 19 has the same delay characteristics as the input circuit 14, and the dummy-input buffer 20 has the same delay characteristics as the input buffer 11.

The phase comparator 16 makes a comparison of the reference-clock signal c-clk with the clock signal supplied from the dummy-input buffer 20. To ensure that both clock signals have the same phase, the phase comparator 16 controls the delay amount of the variable-delay circuit 18 via the delay-control circuit 17. In this manner, the clock signal supplied from the dummy-input circuit 19 is adjusted so as to have a predetermined timing relation with the input clock signal CLK.

When the clock-control circuit 13 is ignored, a total delay of the input buffer 11, the variable-delay circuit 12, and the input circuit 14 is equal to a total delay of the dummy-input buffer 20, the variable-delay circuit 18, and the dummy-input circuit 19. Because of this, the input data supplied from the input circuit 14 ends up having the predetermined timing relation with the input clock signal CLK.

In this configuration, even when the characteristics of the input buffer 11, the variable-delay circuit 12, and the input circuit 14 are changed due to variations in a power voltage and/or temperature, the characteristics of the dummy-input buffer 20, the variable-delay circuit 18, and the dummy-input circuit 19 also change in the same manner. Because of this, the input data supplied from the input circuit 14 to the internal circuits always keeps the same timing relation with the input clock signal CLK regardless of a power-voltage variation and/or a temperature variation.

The lock-on detector 21 checks whether the DLL circuits has locked on, based on signals supplied from the phase comparator 16. That is, the lock-on detector 21 checks whether the two clock signals subjected to phase comparison by the phase comparator 16 have the same phase. When a lock-on condition is established, the lock-on detector 21 controls the frequency divider 15 to lower the frequency of the dummy-clock signal d-clk and the reference-clock signal c-clk, thereby reducing power consumption.

The delay-control circuit 17, when set to a maximum delay amount, outputs an overflow signal OF1. Each of the variable-delay circuits 12 and 18 is comprised of a predetermined number of delay elements arranged in series, and is controlled by the delay-control circuit 17. Because of this configuration, the number of usable delay elements is limited in nature. If the delay amount is set to a possible maximum amount, the variable-delay circuits 12 and 18 cannot further increase the delay. In this case, the overflow signal OF1 indicates the detection of overflow.

The timing-stabilization circuit of FIG. 2 further includes a gate circuit 31, an overflow detector 32, an NAND circuit 33, an inverter 34, an inverter 35, a phase comparator 36, a delay-control circuit 37, variable-delay circuits 38-1 through 38-3, an input circuit 39, a clock-control circuit 40, and an external-output node 41.

The phase comparator 36, the delay-control circuit 37, the variable-delay circuits 38-1 through 38-3, the input circuit 39, and the clock-control circuit 40 are provided in order to generate an internal-clock signal j-clk different from the internal-clock signal i-clk. The internal-clock signal j-clk is then used as a synchronization signal to receive data, which is input to the semiconductor device in addition to the data input to the input circuit 14. The internal-clock signal j-clk in the example of FIG. 2 has a 180°-phase displacement compared to the internal-clock signal i-clk.

The delay-control circuit 37, similar to the delay-control circuit 17, generates an overflow signal OF2 when set to a maximum delay. If the variable-delay circuits 38-1 through 38-3 controlled by the delay-control circuit 37 have a delay adjusted to a possible maximum amount, the delay cannot be further increased. In this case, the overflow signal OF2 is generated to indicate the detection of overflow.

The overflow signal OF1 from the delay-control circuit 17 and the overflow signal OF2 from the delay-control circuit 37 are supplied to the overflow detector 32. The overflow detector 32 generates an overflow signal OF when either the overflow signal OF1 or the overflow signal OF2 is detected. The overflow signal OF is then supplied to the clock-control circuit 13 and the clock-control circuit 40.

Each of the clock-control circuit 13 and the clock-control circuit 40 includes NAND circuits 51 through 53 and inverters 54 and 55 as shown in FIG. 2. When overflow is detected, the clock-control circuit 13 selects the internal-clock signal i-clk bypassing the variable-delay circuit 12 rather than selecting the clock signal supplied from the variable-delay circuit 12, and provides the internal-clock signal i-clk to the input circuit 14. The clock-control circuit 40, when overflow is detected, selects an inverse of the internal-clock signal i-clk supplied from the inverter 35 instead of selecting the clock signal supplied from the variable-delay circuit 38-1. The inverse of the internal-clock signal i-clk is then provided to the input circuit 39.

FIGS. 3A through 3E are timing charts for explaining operations of the clock-control circuit 13. FIGS. 3A through 3E show the input clock signal CLK, the internal-clock signal i-clk, a signal appearing at a node N1 shown in FIG. 2, the overflow signal OF, and a signal appearing at a node N2, respectively. The signal appearing at the node N2 is used as a synchronization signal for inputting data to the input circuit 14.

As shown on the left-hand side of the figures, when the overflow signal OF is LOW, the internal-clock signal i-clk is delayed by the variable-delay circuit 12 so as to generate the signal of the node N1, which is selected by the clock-control circuit 13 to become the signal of node M2. For the sake of explanation, assume that the variable-delay circuit 12 is being set to a maximum delay amount. In this case, the delay of the variable-delay circuit 12 falls short of an appropriate delay amount, so that the input circuit 14 cannot latch input data when the input data is provided at a timing corresponding to a rising edge of the clock signal CLK shown by an arrow in FIG. 3A.

The configuration of FIG. 2, on the contrary to the above-described scenario, actually has the overflow signal OF becoming HIGH when the overflow is detected. When this happens, the internal-clock signal i-clk is directly supplied to the clock-control circuit 13, and is provided as the signal of the node N2. In this case, the input data provided at a rising-edge timing of the clock signal CLK can be latched while insuring a sufficient data-hold time.

FIGS. 4A through 4G are timing charts for explaining operations of the clock-control circuit 40. FIGS. 4A through 4G show the input clock signal CLK, the internal-clock signal i-clk, an inverse clock signal /i-clk which is an inverse of the internal-clock signal i-clk, the signal of the node N1, a signal appearing at a node N3 shown in FIG. 2, the overflow signal OF, and the internal-clock signal j-clk, respectively. The internal-clock signal j-clk is used as a synchronization signal for inputting data to the input circuit 39.

As shown on the left-hand side of the figures, when the overflow signal OF is LOW, the internal-clock signal i-clk is delayed by the variable-delay circuit 12 so as to generate the signal of the node N1, which is delayed by the variable-delay circuit 38-1 to become the signal of the node N3, and, then, the signal of the node N3 passes through the clock-control circuit 40 to be supplied as the internal-clock signal j-clk. For the sake of explanation, assume that the variable-delay circuit 12 and/or the variable-delay circuit 38-1 are being set to a maximum delay amount. In this case, the delay of the variable-delay circuit 12 and/or the variable-delay circuit 38-1 falls short of an appropriate delay amount, so that the input circuit 39 fails to latch input data when the input data is provided at a timing corresponding to a falling edge of the clock signal CLK shown by an arrow in FIG. 4A.

The configuration of FIG. 2, on the contrary to the above-described scenario, actually has the overflow signal OF becoming HIGH when the overflow is detected. When this happens, the inverse clock signal /i-clk, which is an inverse of the internal-clock signal i-clk, is directly supplied to the clock-control circuit 40, and is provided as the internal-clock signal j-clk. In this scenario, therefore, the input data provided at a falling-edge timing of the clock signal CLK can be latched while insuring a sufficient data-hold time.

The overflow signal OF from the overflow detector 32 is further supplied to the outside of the semiconductor device via the NAND circuit 33, the inverter 34, and the external-output node 41. A test-mode signal, which is another input to the NAND circuit 33, becomes active when the semiconductor device is subjected to a test. The test-mode signal is set in response to an input to the semiconductor device. It is a normal practice to use such a test-mode signal in conventional semiconductor devices which are equipped with a test mode.

Supplying the overflow signal OF to the outside of the semiconductor device in a test mode makes it possible to check whether the semiconductor device is experiencing any overflow.

The overflow signal OF from the overflow detector 32 is further supplied to the gate circuit 31. The gate circuit 31, as shown in FIG. 2, includes an inverter 61 and a NOR circuit 62. When the overflow signal OF becomes HIGH, the gate circuit 31 outputs a HIGH signal at all times. The detection of overflow, therefore, prevents the internal-clock signal i-clk from entering the variable-delay circuit 12.

The stoppage of supply of the internal-clock signal i-clk to the variable-delay circuit 12 can suppress excessive power consumption at the time when the overflow is detected.

Further, the overflow signal OF from the overflow detector 32 is supplied to the frequency divider 15. When the overflow signal OF becomes HIGH, the frequency divider 15 lowers the rate of frequency division so as to lower the frequency of the dummy-clock signal d-clk.

In this manner, the variable-delay circuits 18, 38-2, and 38-3 can have reduced power consumption, yet control a delay of the dummy-clock signal d-clk at appropriate intervals, thereby continuing phase control in preparation for when the overflow condition comes to an end.

Figure 5:
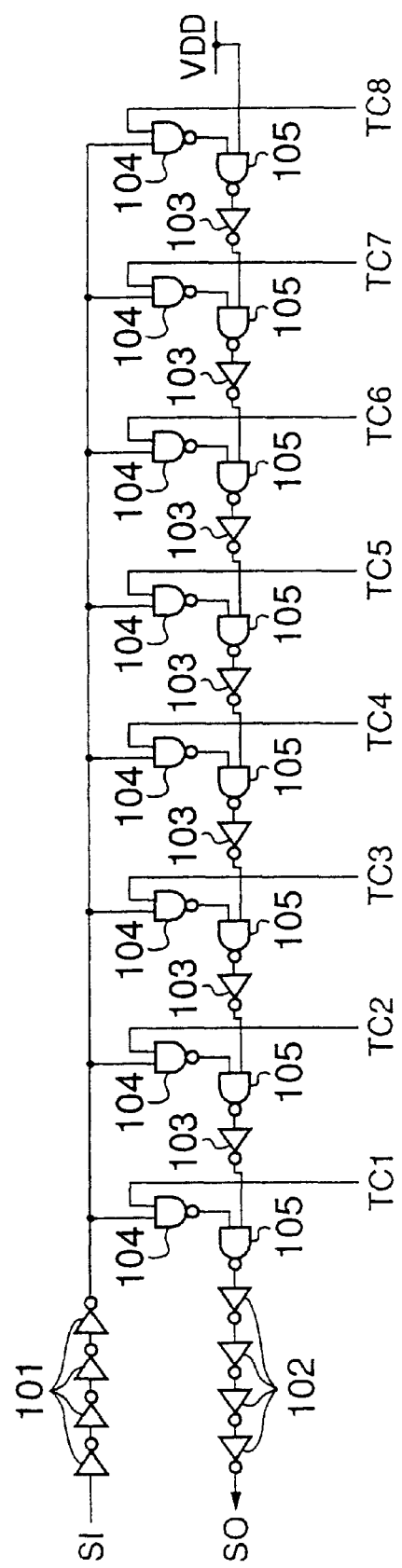
FIG. 5 is a circuit diagram of a variable-delay circuit.

FIG. 5 is a circuit diagram of a variable-delay circuit. The variable-delay circuits 12, 18, and 38-1 through 38-3 have the same circuit configuration shown in FIG. 5.

The variable-delay circuit of FIG. 5 includes a plurality of inverters 101, a plurality of inverters 102, a plurality of inverters 103, a plurality of NAND circuits 104, and a plurality of NAND circuits 105. A given one of the inverters 103 and a corresponding one of the NAND circuits 105 together form one stage of a delay element, such that the plurality of inverters 103 and the plurality of NAND circuits 105 together form a series of delay elements having a plurality of delay stages. Control signals TC1 through TC8 are supplied to the NAND circuits 104, and are provided from the delay-control circuit 17 or the delay-control circuit 37. A detailed description of the control signals TC1 through TC8 will be provided later. For the understanding of the circuit operations of FIG. 5, it should be pointed out that only two adjacent signals are HIGH among the control signals TC1 through TC8, and the remaining control signals are LOW.

An input signal S1 is supplied to the plurality of NAND circuits 104 via the plurality of inverters 101. The input signal S1 passes through a given one of the NAND circuits 104 when this NAND circuit 104 receives a HIGH signal as one of the control signals TC1 through TC8, and enters the series of delay elements comprised of the plurality of inverters 103 and the plurality of NAND circuits 105. The input signal SI propagates through the series of delay elements, and is output as an output signal SO after passing through the plurality of inverters 102. Depending on a position of the two adjacent signals which are HIGH among the control signals TC1 through TC8, the input signal SI passes through a different number of delay stages. Control of this position makes it possible to adjust how much the input signal SI is delayed.

Figure 6:
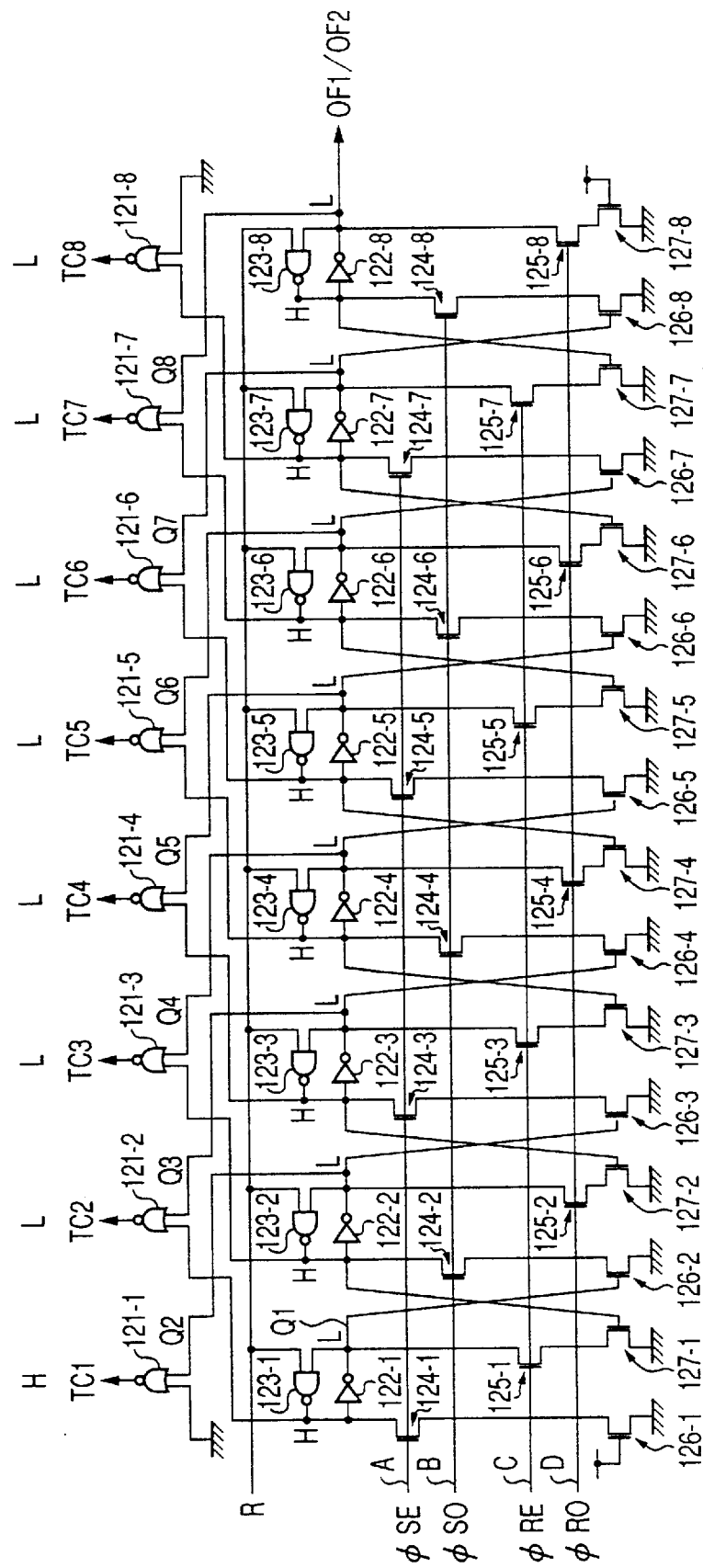
FIG. 6 is a circuit diagram of a delay-control circuit.

FIG. 6 is a circuit diagram of a delay-control circuit. The delay-control circuits 17 and 37 of FIG. 2 have the same configuration as shown in FIG. 6, and generate the control signals TC1 through TC8 described above.

The delay-control circuit includes NOR circuits 121-1 through 121-8, inverters 122-1 through 122-8, NAND circuits 123-1 through 123-8, NMOS transistors 124-1 through 124-8, NMOS transistors 125-1 through 125-8, NMOS transistors 126-1 through 126-8, and NMOS transistors 127-1 through 127-8. When a reset signal R is turned to LOW, the delay-control circuit is reset. Namely, when the reset signal R becomes LOW, outputs of the NAND circuits 123-1 through 123-8 become HIGH, and outputs of the inverters 122-1 through 122-8 become LOW. A pair of a given one of the NAND circuits 123-1 through 123-8 and a corresponding one of the inverters 122-1 through 122-8 forms a latch in which one element of the pair receives an output of the other element as an input. An initial state created by the reset signal R is thus kept even after the reset signal R returns to HIGH.

In this initial state, the output TC1 of the NOR circuit 121-1 is HIGH as shown in FIG. 6, and the remaining NOR circuits 121-2 through 121-8 have the outputs TC2 through TC8, respectively, which are LOW. That is, only the output TC1 is HIGH among the outputs TC1 through TC8.

When there is a need to increase the amount of delay with respect to a signal subjected to phase adjustment, HIGH pulses are supplied to signal lines A and B in turn. With a HIGH pulse of a signal ΦSE supplied to the signal line A, the NMOS transistor 124-1 is turned on. Since the NMOS transistor 126-1 is in a turned-on state, an output of the NAND circuit 123-1 is connected to the ground, and is forced to change from HIGH to LOW, so that an output of the inverter 122-1 becomes HIGH. This condition is latched by the latch comprising the NAND circuit 123-1 and the inverter 122-1. As a result, the output TC2 is changed from LOW to HIGH. In this condition, therefore, only the outputs TC1 and TC2 are HIGH.

With a HIGH pulse of a signal ΦSO supplied to the signal line B, the NMOS transistor 124-2 is turned on. Since the NMOS transistor 126-2 is already in a turned-on state, an output of the NAND circuit 123-2 is connected to the ground, and is forced to change from HIGH to LOW, so that an output of the inverter 122-2 becomes HIGH. This condition is latched by the latch comprising the NAND circuit 123-2 and the inverter 122-2. As a result, the output TC1 is changed from HIGH to LOW, while the output TC3 is turned from LOW to HIGH. In this condition, therefore, only the outputs TC2 and TC3 are HIGH.

As described above, HIGH pulses are supplied in turn to the signal lines A and B to shift a position to the right one by one when this position marks the only two HIGH outputs among the outputs TC1 through TC8.

When there is a need to decrease the delay amount, HIGH pulses are supplied to signal lines C and D in turn. Operations in this case are simply a reverse of the above-described operations, and a description thereof will be omitted.

The output signals TC1 through TC8 generated in this manner are supplied to the variable-delay circuit so as to adjust a delay of a signal when this signal is subjected to a phase adjustment.

Signals ΦSE, ΦSO, ΦRE, and ΦRO are supplied to the signal lines A through D. These signals ΦSE, ΦSO, ΦRE, and ΦRO are generated by the phase comparator 16 and the phase comparator 36 of FIG. 2.

Figure 7:
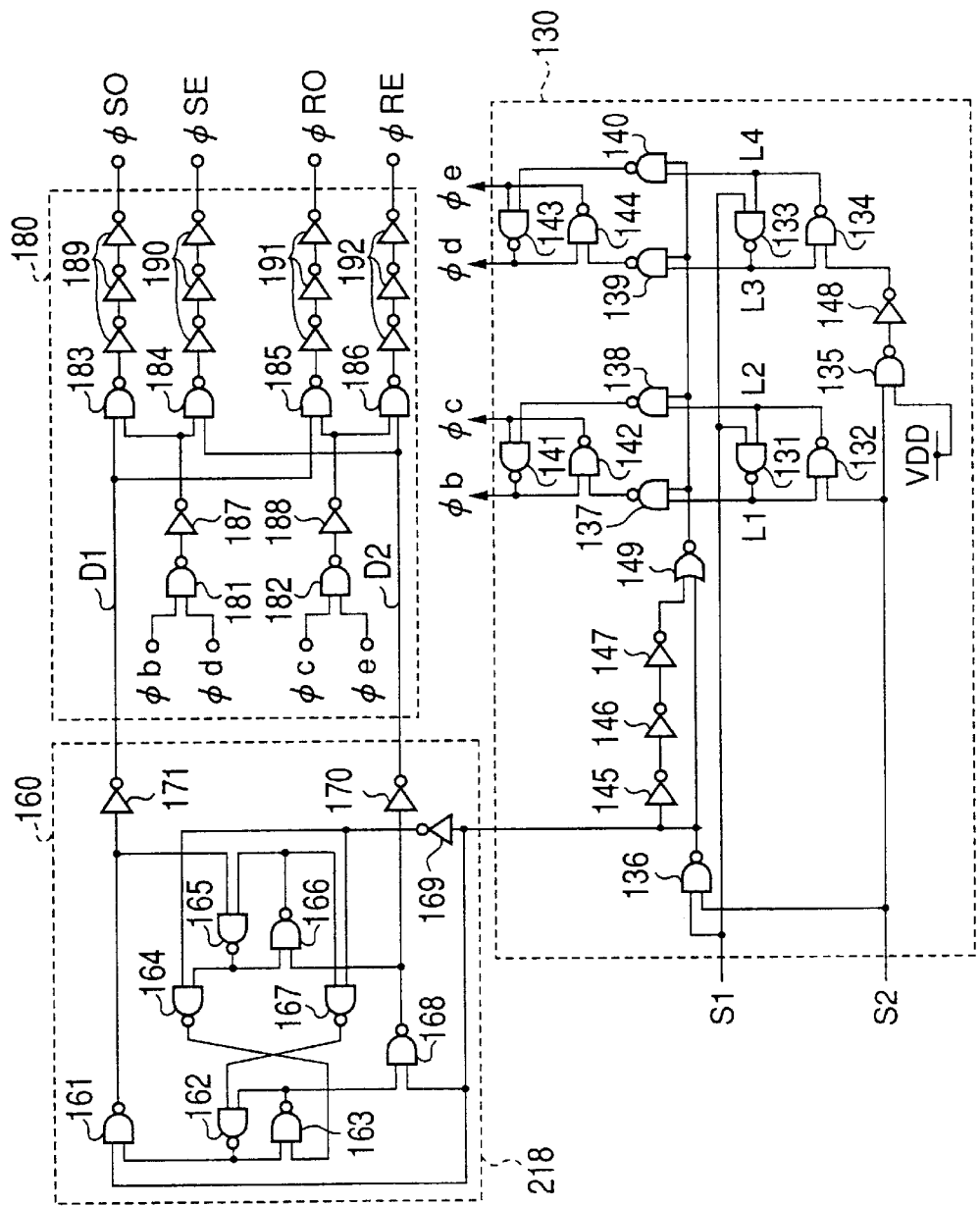
FIG. 7 is a circuit diagram showing a circuit configuration of a phase comparator.

FIG. 7 is a circuit diagram showing a circuit configuration of a phase comparator. The phase comparators 16 and 36 have the same circuit structure as shown in FIG. 7.

The phase comparator of FIG. 7 includes an edge-timing-comparison circuit 130, a binary counter 160, and a pulse-generation circuit 180.

The edge-timing-comparison circuit 130 includes NAND circuits 131 through 144, inverters 145 through 148, and a NOR circuit 149. The binary counter 160 includes NAND circuits 161 through 168 and inverters 169 through 171. The pulse-generation circuit 180 includes NAND circuits 181 through 186 and inverters 187 through 192.

The edge-timing-comparison circuit 130 receives input signals S1 and S2, and determines which one of the input signals S1 and S2 has a rising edge ahead of the other. One of the input signals S1 and S2 corresponds to the dummy-clock signal d-clk, and the other corresponds to the reference-clock signal c-clk.

If a rising edge of the input signal S1 is ahead of a rising edge of the input signal S2, a latch comprised of the NAND circuits 131 and 132 produces outputs L1 and L2 which are LOW and HIGH, respectively. Also, a latch formed by the NAND circuits 133 and 134 generates output L3 and L4 which are LOW and HIGH, respectively.

After this, both of the input signals S1 and S2 become HIGH, which changes an output of the NAND circuit 136 to LOW. This prompts the NOR circuit 149 to produce a HIGH output for a predetermined period of time. The HIGH output of the NOR circuit 149 opens gates of the NAND circuits 137 through 140, so that the latch outputs L1 through L4 are inverted and input to two latches comprised of NAND circuits 141 through 144. The latch comprised of NAND circuits 141 and 142 thus has outputs Φb and Φc which are HIGH and LOW, respectively. Also, the latch comprised of NAND circuits 143 and 144 has outputs Φd and Φe which are HIGH and LOW, respectively.

In this manner, when the input signal S1 has a rising edge ahead in time, the NAND circuit 181 of the pulse-generation circuit 180 changes an output thereof to LOW.

When a rising edge of the input signal S2 is ahead of a rising edge of the input signal S1 by a sufficient margin, the latch outputs Φb and Φc become LOW and HIGH, respectively, and, also, the latch outputs Φd and Φe become LOW and HIGH, respectively. In this case, therefore, the NAND circuit 182 of the pulse-generation circuit 180 changes an output thereof to LOW.

When a rising edge of the input signal S2 is ahead of a rising edge of the input signal S1 only by a small margin, the latch comprised of the NAND circuits 133 and 134 produces the outputs L3 and L4 which are LOW and HIGH, respectively, because of a signal delay introduced by the NAND circuit 135 and the inverter 148. In this case, the latch outputs Φb and Φc are LOW and HIGH, respectively, whereas the latch outputs Φd and Φe are HIGH and LOW, respectively. The NAND circuits 181 and 182 of the pulse-generation circuit 180 thus do not change outputs thereof, and these outputs remain at the HIGH level.

In this manner, when a difference in rising-edge timings is small between the input signal S1 and the input signal S2, i.e., when the rising edges can be regarded as having the same timing, the phase comparator of FIG. 7 does not generate an output.

The binary counter 160 divides a frequency of a signal by half when receiving the signal from the NAND circuit 136 of the edge-timing-comparison circuit 130. The binary counter 160 outputs a frequency-divided signal D1 from the inverter 171, and outputs a frequency-divided signal D2 from the inverter 170. The signal from the NAND circuit 136 has the same cycle as the input signals S1 and S2. Because of this, the frequency-divided signal D1 output from the binary counter 160 becomes HIGH during even-number cycles of the input signals, for example. In this case, the frequency-divided signal D2 becomes HIGH during odd-number cycles.

In the pulse-generation circuit 180, the output of the NAND circuit 181 becomes LOW when the input signal S1 is ahead of the input signal S2, as previously described. On the other hand, when the input signal S2 is ahead in time by a sufficient margin, the output of the NAND circuit 182 becomes LOW.

When the input signal S1 is ahead in time, the output of the NAND circuit 181 is inverted by the inverter 187, and is supplied to the NAND circuit 183 and 184 as a HIGH signal. The NAND circuit 183 further receives the frequency-divided signal D1, and the NAND circuit 184 further receives the frequency-divided signal D2. In this case, therefore, the pulse-generation circuit 180 generates HIGH pulses as the signal ΦSE or the signal ΦSO in turn When the input signal S2 is ahead in time by a sufficient margin, the output of the NAND circuit 182 is inverted by the inverter 188, and is supplied to the NAND circuit 185 and 186 as a HIGH signal. The NAND circuit 185 further receives the frequency-divided signal D1, and the NAND circuit 186 further receives the frequency-divided signal D2. In this case, therefore, the pulse-generation circuit 180 generates HIGH pulses as the signal ΦRO and the signal ΦRE in turn.

These signals ΦSE, ΦSO, ΦRE, and ΦRO are supplied to the delay-control circuit shown in FIG. 6. In this manner, the delay of the variable-delay circuit of FIG. 5 can be controlled via the delay-control circuit of FIG. 5, depending on which one of the signals S1 and S2 has a rising edge ahead of the other.

Figure 8:
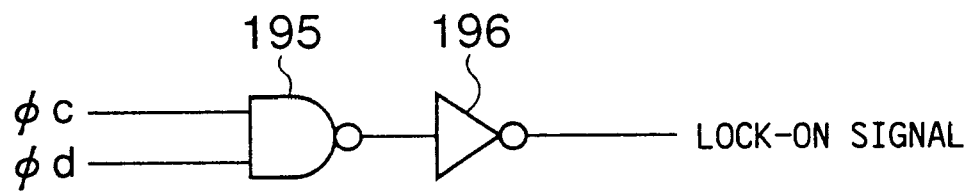
FIG. 8 is a circuit diagram showing an example of a circuit configuration of a lock-on detector shown in FIG. 2.

FIG. 8 is a circuit diagram showing an example of a circuit configuration of the lock-on detector 21 shown in FIG. 2.

The lock-on detector 21 of FIG. 8 includes a NAND circuit 195 and an inverter 196. The NAND circuit 195 receives the signals Φc and Φd from the edge-timing-comparison circuit 130 of the phase comparator shown in FIG. 7. As previously described, the edge-timing-comparison circuit 130 when engages in a timing comparison between two signals produces the signals Φc and Φd that are HIGH if a timing difference between the two signals falls within a predetermined timing range. This indicates a condition in which the clock signal is locked on.

When the clock signal is locked on, therefore, the NAND circuit 195 receiving the signals Φc and Φd generates a LOW output, so that the lock-on detector 21 outputs a HIGH signal from the inverter 196.

Figure 9:
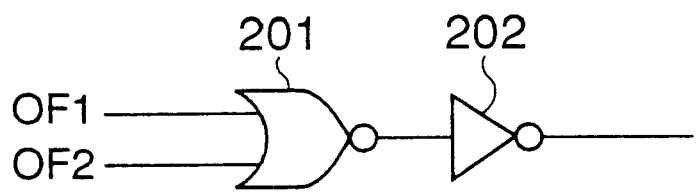
FIG. 9 is a circuit diagram showing an example of a circuit configuration of an overflow detector shown in FIG. 2.

FIG. 9 is a circuit diagram showing an example of a circuit configuration of the overflow detector 32 shown in FIG. 2.

The overflow detector 32 of FIG. 9 includes a NOR circuit 201 and an inverter 202. The NOR circuit 201 receives the overflow signal OF1 from the delay-control circuit 17 and the overflow signal OF2 from the delay-control circuit 37 when these overflow signals are provided from the inverter 122-8 of the delay-control circuit shown in FIG. 6.

As can be understood from the description regarding the operations of the delay-control circuit shown in FIG. 6, if a pulse of the signal ΦSO is supplied to the signal line B with an aim of increasing a delay under the conditions in which the control signals TC7 and TC8 are HIGH, the control signal TC7 is changed to LOW. In this case, the output of the inverter 122-8 becomes HIGH. This situation corresponds to a state in which the delay-control circuit suffers from an overflow.

Accordingly, when the delay-control circuit 17 or 37 experiences overflow, either the overflow signal OF1 or the overflow signal OF2 becomes HIGH, so that the NOR circuit 201 generates a LOW output. The overflow detector 32 in this case outputs a HIGH signal as the overflow signal OF from the inverter 202.

Figure 10:
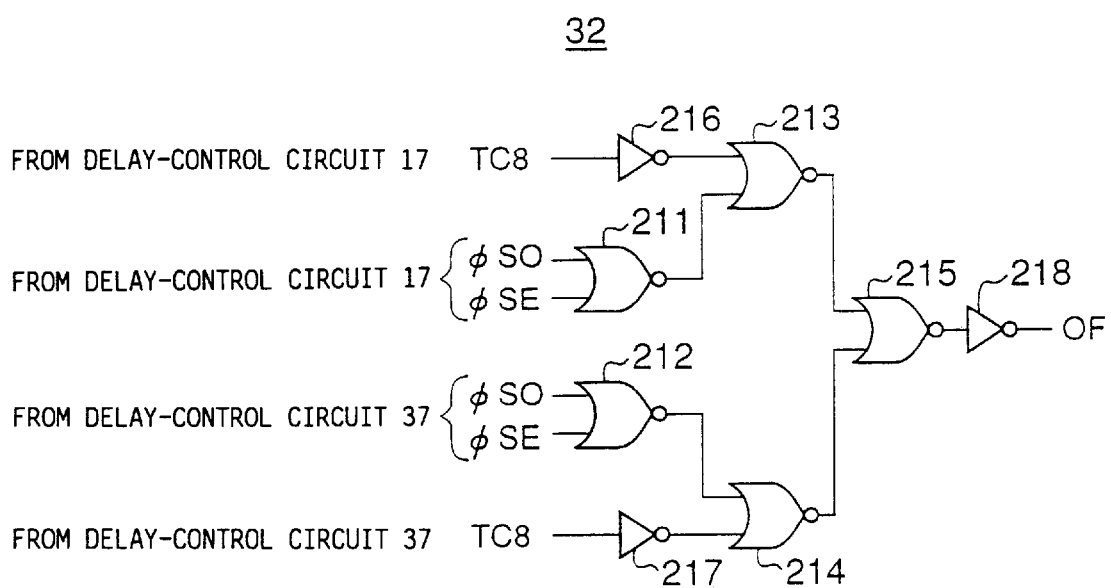
FIG. 10 is a circuit diagram showing another example of a circuit configuration of the overflow detector.

FIG. 10 is a circuit diagram showing another example of a circuit configuration of the overflow detector 32 shown in FIG. 2. The overflow detector 32 of FIG. 10 includes NOR circuits 211 through 215 and inverters 216 through 218.

The NOR circuits 211 and 213 and the inverter 216 are provided for the purpose of detecting an overflow of the delay-control circuit 17. When the control signal TC8 of the delay-control circuit 17 becomes HIGH, the output of the inverter 216 becomes LOW, indicating that the delay has reached a maximum amount thereof. When a HIGH pulse of either the signal ΦSO or the signal ΦSE is supplied to the delay-control circuit 17 in an attempt to increase the delay, an output of the NOR circuit 211 becomes LOW. The NOR circuit 213 thus produces a HIGH output.

By the same token, the NOR circuits 212 and 214 and the inverter 217 detect the overflow of the delay-control circuit 37. Namely, when overflow is detected in the delay-control circuit 37, an output of the NOR circuit 214 becomes HIGH.

The NOR circuit 215 and the inverter 218 performs an OR operation between the output of the NOR circuit 213 and the output of the NOR circuit 214 so as to generate the overflow signal OF.

Figure 11:
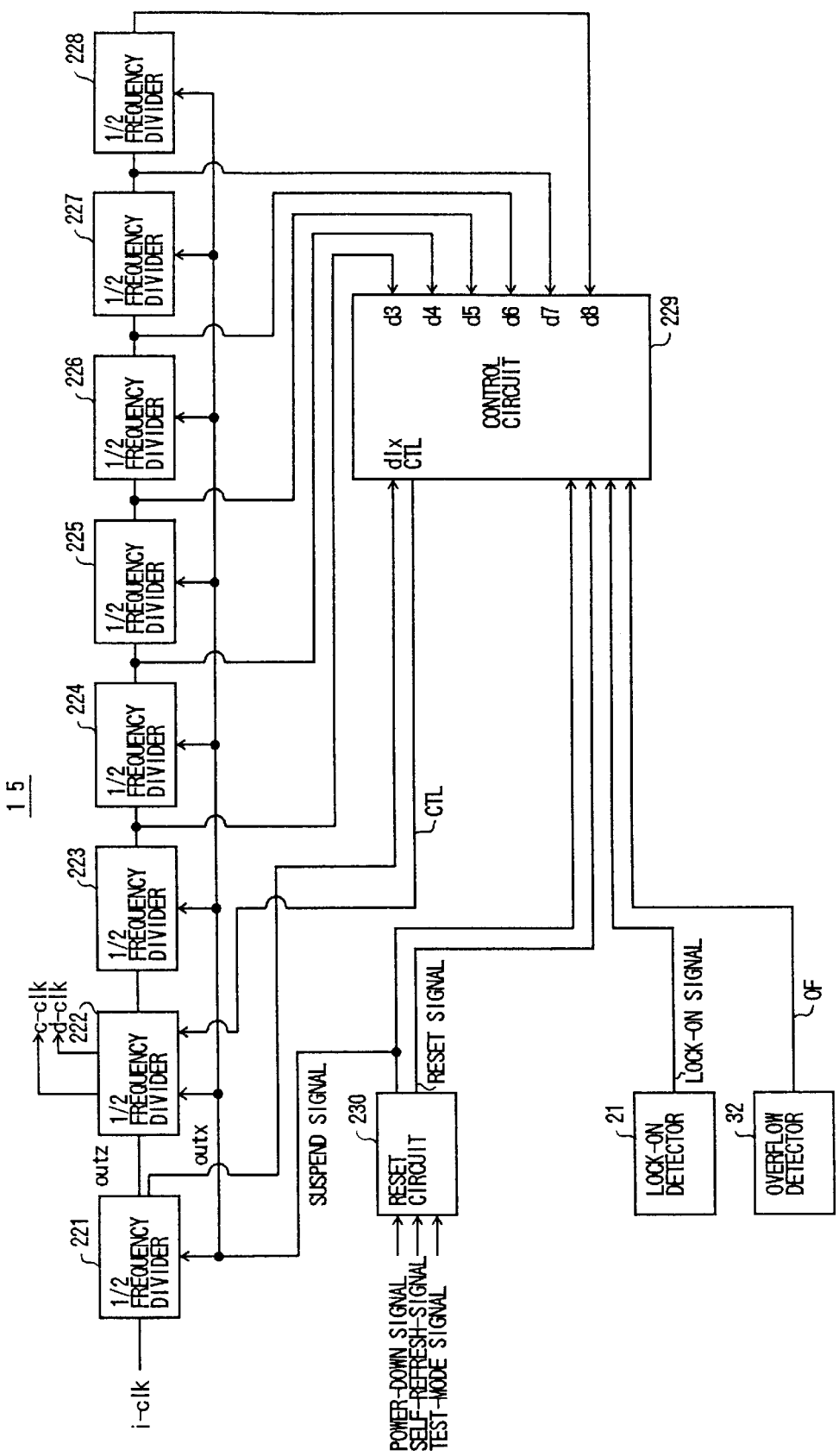
FIG. 11 is a block diagram of a frequency divider shown in FIG. 2.

FIG. 11 is a block diagram of the frequency divider 15 shown in FIG. 2.

The frequency divider 15 of FIG. 11 includes ½ frequency dividers 221 through 228, a control circuit 229, and a reset circuit 230. Each of the ½ frequency dividers 221 through 228 divides a frequency of a signal by half when the signal is supplied thereto. The ½ frequency divider 222 generates the reference-clock signal c-clk and the dummy-clock signal d-clk.

The ½ frequency divider 221 receives the internal-clock signal i-clk, and provides the ½ frequency divider 222 situated next thereto with a ½-frequency-divided clock signal. The ½ frequency divider 222 further divides the frequency of the ½-frequency-divided clock signal by half, and supplies a ¼-frequency-divided clock signal to the ½ frequency divider 223 provided at a next stage. In this manner, the ½ frequency divider 228 at the last stage produces a 1/256-frequency-divided clock signal.

The reset circuit 230 receives a power-down signal, a self-refresh signal, and a test-mode signal from the exterior of the semiconductor device, and produces a reset signal and a suspend signal based on these received signals. The reset signal and the suspend signal are used for controlling the ½ frequency dividers 221 through 228 and the control circuit 229. When the suspend signal is HIGH, the ½ frequency dividers 221 through 228 and the control circuit 229 stop all the operations thereof. When the reset signal is HIGH, the control circuit 229 produces a control signal CTL that is HIGH. In this case, the reference-clock signal c-clk and the dummy-clock signal d-clk output from the ½ frequency divider 222 is a ¼-frequency-divided clock signal having a quarter the frequency of the internal-clock signal i-clk.

The control circuit 229 receives the reset signal and the suspend signal from the reset circuit 230, the lock-on signal from the lock-on detector 21, and the overflow signal OF from the overflow detector 32, and generates the control signal CTL to control the ½ frequency divider 222.

When the lock-on signal is HIGH (indicating the lock-on state), the control signal CTL becomes HIGH at a timing marked by simultaneous HIGH levels of all the frequency-divided clock signal d3 through d8. By using this control signal CTL, the ½ frequency divider 222 produces the reference-clock signal c-clk and the dummy-clock signal d-clk that are a 1/256-frequency-divided clock signal having 1/256 the frequency of the internal-clock signal i-clk.

By the same token, when the overflow signal OF is HIGH (indicating an overflow), the control signal CTL becomes HIGH at a timing marked by simultaneous HIGH levels of all the frequency-divided clock signal d3 through d8. By using this control signal CTL, the ½ frequency divider 222 produces the reference-clock signal c-clk and the dummy-clock signal d-clk that are a 1/256-frequency-divided clock signal having 1/256 the frequency of the internal-clock signal i-clk.

Figure 12:
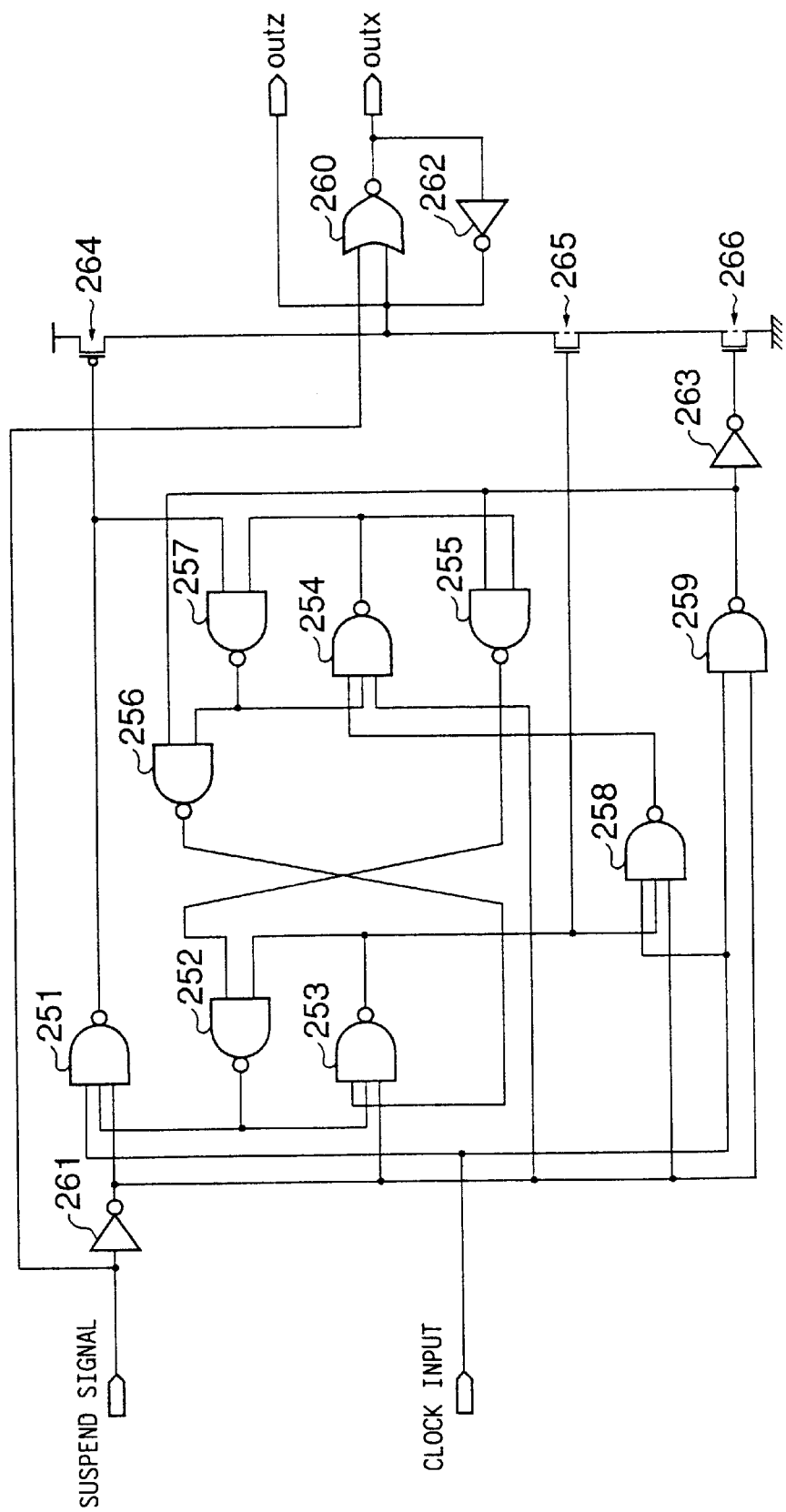
FIG. 12 is a circuit diagram showing a circuit structure of a ½ frequency divider of FIG. 11.

FIG. 12 is a circuit diagram showing a circuit structure of a ½ frequency divider. The ½ frequency dividers 221 and 223–228 have the same circuit structure shown in FIG. 12.

The ½ frequency divider of FIG. 12 includes NAND circuits 251 through 259, a NOR circuit 260, inverters 261 through 263, a PMOS transistor 264, and NMOS transistors 265 and 266. The circuit structure of the ½ frequency divider shown in FIG. 12 is within the scope of the prior art, and a description thereof will be omitted.

Figure 13:
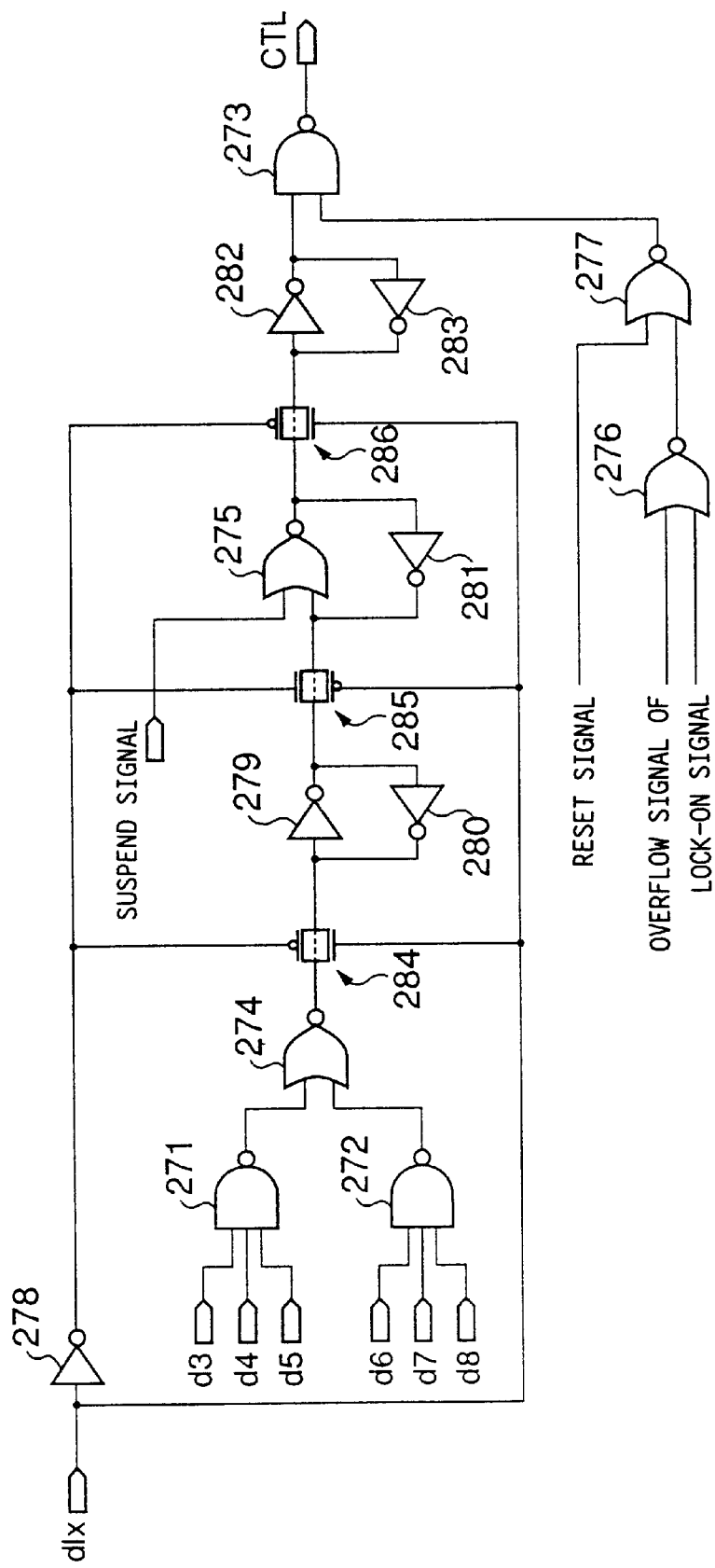
FIG. 13 is a circuit diagram showing a circuit structure of a control circuit of FIG. 11.

FIG. 13 is a circuit diagram showing a circuit structure of the control circuit 229.

The control circuit 229 of FIG. 13 includes NAND circuits 271 through 273, NOR circuits 274 through 277, inverters 278 through 283, and gates 284 through 286 each comprised of a PMOS transistor and an NMOS transistor.

When the reset signal is HIGH, an output of the NOR circuit 277 is LOW, so that the control signal CTL is always HIGH. With the reset signal being LOW, the NOR circuit 277 has a LOW output as long as the overflow signal OF and the lock-on signal are LOW, thereby keeping the control signal CTL at a HIGH level. Once at least one of the overflow signal OF and the lock-on signal is changed to HIGH, the output of the NOR circuit 277 is turned to HIGH, so that the NAND circuit 273 allows data latched by the inverters 282 and 283 to pass therethrough and to be output as the control signal CTL.

An output of the NOR circuit 274 becomes HIGH at a timing when all the frequency-divided signal d3 through d8 become HIGH. The output of the NOR circuit 274 is supplied as the control signal CTL via the gate 284, a latch (the inverters 279 and 280), the gate 285, a latch (the NOR circuit 275 and the inverter 281), the gate 286, a latch (the inverters 282 and 283), and the NAND circuit 273. A signal dlx is a ½-frequency-divided clock signal supplied from the ½ frequency divider 221, and is used for timing control of opening and closing the gates 284 through 286. When the suspend signal is HIGH, the output of the NOR circuit 275 is LOW at all times, so that the control signal CTL is kept at a LOW level.

The control signal CTL described above is supplied to the ½ frequency divider 222.

Figure 14:
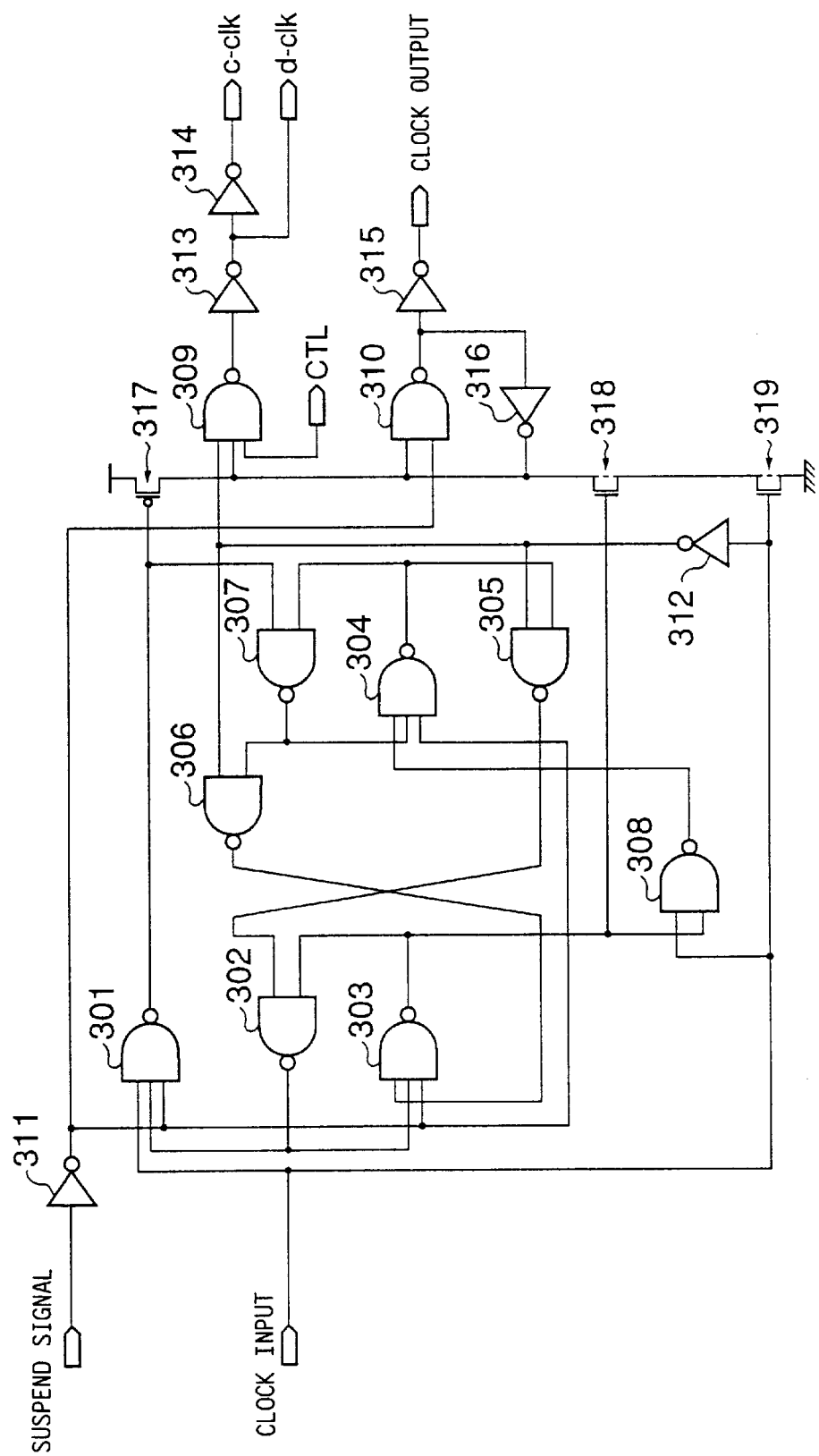
FIG. 14 is a circuit diagram showing a circuit diagram of a ½ frequency divider of FIG. 11.

FIG. 14 is a circuit diagram showing a circuit diagram of the ½ frequency divider 222.

The ½ frequency divider 222 of FIG. 14 includes NAND circuits 301 through 310, inverters 311 through 316, a PMOS transistor 317, and NMOS transistors 318 and 319.

When the control signal CTL supplied to the NAND circuit 309 is HIGH, an output of the NAND circuit 309 changes to HIGH at a timing when both the ½-frequency-divided clock signal and the ¼-frequency-divided clock signal become HIGH. In this case, therefore, the reference-clock signal c-clk and the dummy-clock signal d-clk become HIGH once in every four cycles.

When the control signal CTL becomes HIGH at a timing marked by simultaneous HIGH levels of all the frequency-divided clock signals d3 through d8, the output of the NAND circuit 309 changes to HIGH at a timing when all the ½-frequency-divided clock signal through the 1/256-frequency-divided clock signal become HIGH. In this case, therefore, the reference-clock signal c-clk and the dummy-clock signal d-clk become HIGH once in every 256 cycles.

Figure 15:
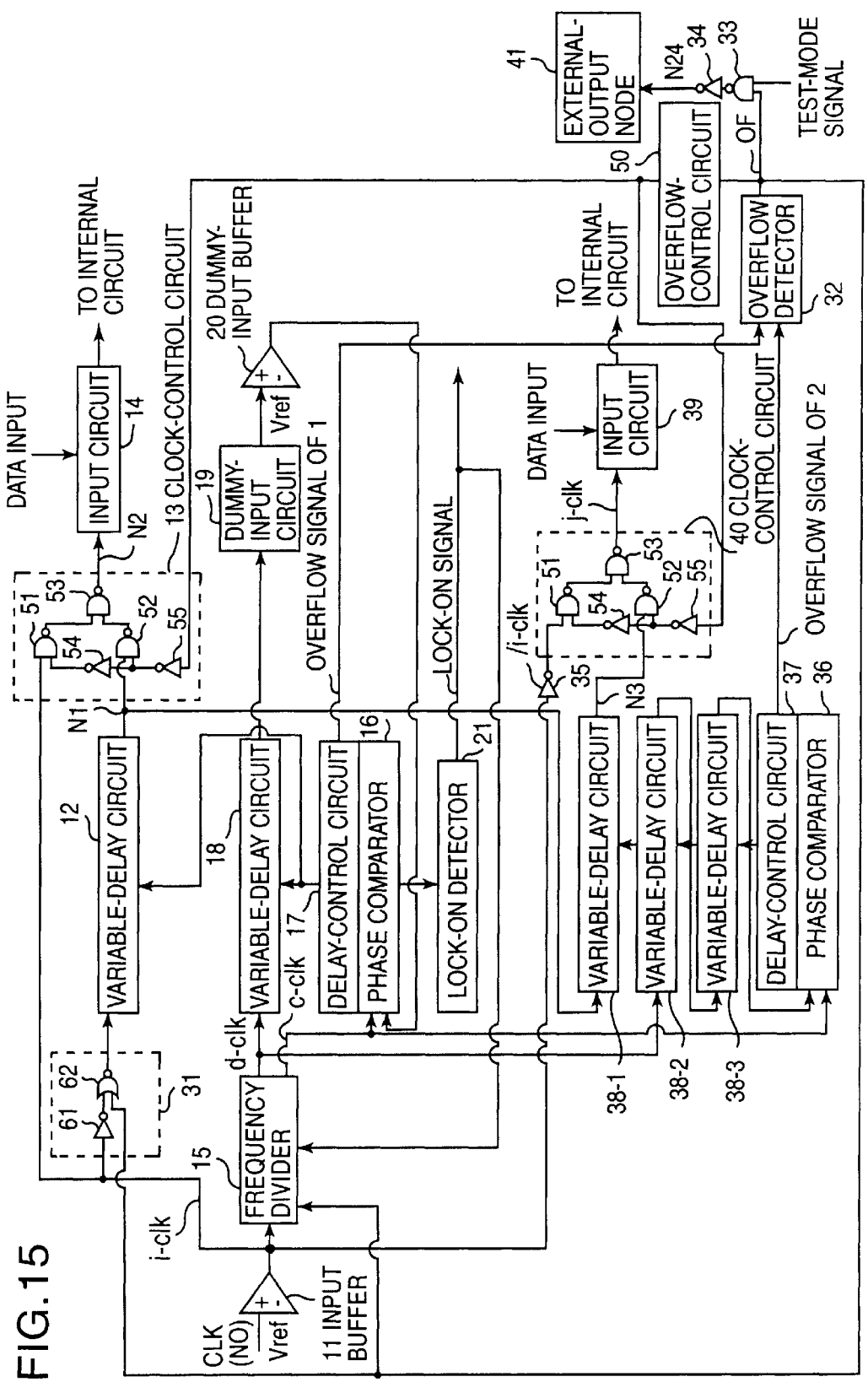
FIG. 15 is a block diagram showing a variation of a timing-stabilization circuit of FIG. 2.

FIG. 15 is a block diagram showing a variation of the timing-stabilization circuit of FIG. 2. In FIG. 15, the same elements as those of FIG. 2 are referred to by the same numerals, and a description thereof will be omitted.

The timing-stabilization circuit of FIG. 15 has an overflow-control circuit 50 additionally provided to the timing-stabilization circuit of FIG. 2. The overflow-control circuit 50 makes it possible to effect clock-signal switching control based on signals to which settings are made from the exterior of the device. With the overflow-control circuit 50, the clock-control circuits 13 and 40 can switch the clock signal not only based on the overflow signal OF but also based on the externally provided signals in the test mode for testing the semiconductor device.

Figure 16:
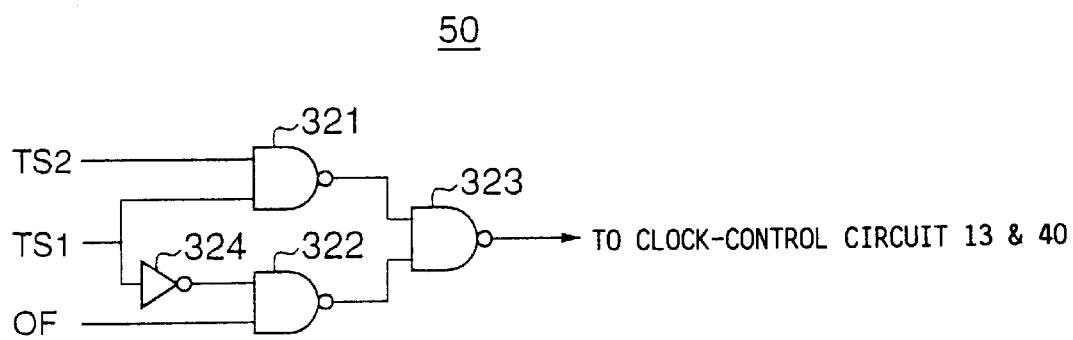
FIG. 16 is a circuit diagram showing a circuit configuration of an overflow-control circuit of FIG. 15.

FIG. 16 is a circuit diagram showing a circuit configuration of the overflow-control circuit 50.

The overflow-control circuit 50 of FIG. 16 includes NAND circuits 321 through 323 and an inverter 324. As test mode signals, signals TS1 and TS2 are used in this configuration.

As the signal TS1 is changed to LOW, the overflow signal OF is supplied to the clock-control circuits 13 and 40 via the NAND circuits 322 and 323. In this case, therefore, the configuration of FIG. 15 performs the same operations as the configuration of FIG. 2.

As the signal TS1 is changed HIGH, the signal TS2 is supplied to the clock-control circuits 13 and 40 via the NAND circuits 321 and 323. In this case, therefore, the signal TS2 can control the clock-switch operations of the clock-control circuits 13 and 40. Namely, the clock-control circuit 13, for example, selects either the clock signal from the variable-delay circuit 12 or the clock signal bypassing the variable-delay circuit 12, depending on whether the signal TS2 is set to HIGH or LOW. A free selection of a clock signal thus can be made.

Figure 17:
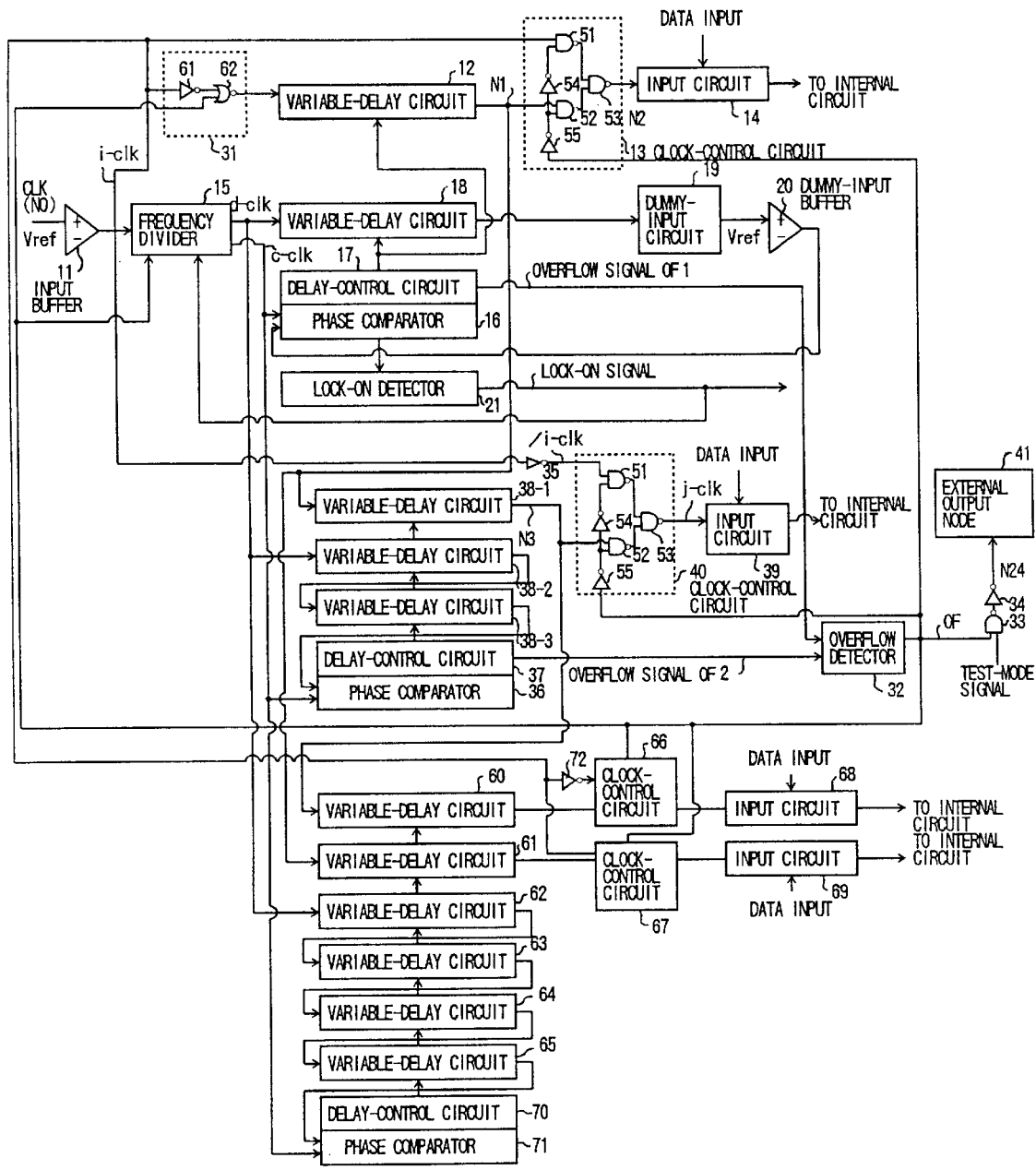
FIG. 17 is a block diagram of a second embodiment of a timing stabilization circuit according to the present invention.

FIG. 17 is a block diagram of a second embodiment of a timing stabilization circuit according to the present invention. In FIG. 17, the same elements as those in FIG. 2 are referred to by the same numerals, and a description thereof will be omitted.

The timing-stabilization circuit of FIG. 17 according to the second embodiment includes variable-delay circuits 60 through 65, clock-control circuits 66 and 67, input circuits 68 and 69, a delay-control circuit 70, a phase comparator 71, and an inverter 72 in addition to the configuration of FIG. 2. The variable-delay circuits 60 through 65 have the same configuration as that of the variable-delay circuit 12 of FIG. 2, and the clock-control circuits 66 and 67 have a configuration identical to those of the clock-control circuits 13 and 40 of FIG. 2. Further, the delay-control circuit 70 and the phase comparator 71 are respectively identical to the delay-control circuit and the phase comparator of FIG. 2.

In FIG. 2, the input circuit 14 takes in data in synchronism with a clock signal which is adjusted to have the same phase with the input clock signal CLK, and the input circuit 39 latches data in synchronism with a clock signal that is adjusted to have a 180°-phase displacement relative to the input clock signal CLK. When overflow is detected, the input circuit 14 alternately uses the input clock signal CLK, and the input circuit 39 alternately uses an inverse of the input clock signal CLK.

In FIG. 17, further, the input circuit 68 latches data in synchronism with a clock signal by adjusting the clock signal to have a 270°-phase displacement with the input clock signal CLK. The input circuit 69 uses a clock signal having an adjusted 90°-phase displacement relative to the input clock signal CLK. When overflow is detected, the input circuit 68 uses an inverse of the input clock signal CLK as a substitute, and the input circuit 69 uses the input clock signal CLK as a substitute.

In this manner, the timing-stabilization circuit of FIG. 17 makes a clock-signal switch upon detection of overflow with regard to not only the clock signals having an adjusted 0°-phase or 180°-phase displacement but also other clock signals having different adjusted phases.

In the embodiments described hereinbefore, the DLL circuit comprised of a variable-delay circuit, a delay-control circuit, and a phase comparator has been described as having a single-stage structure. Alternately, the DLL circuit may have a two-stage structure including one stage for a rough-adjustment circuit and the other stage for a fine-adjustment circuit.

Figure 18:
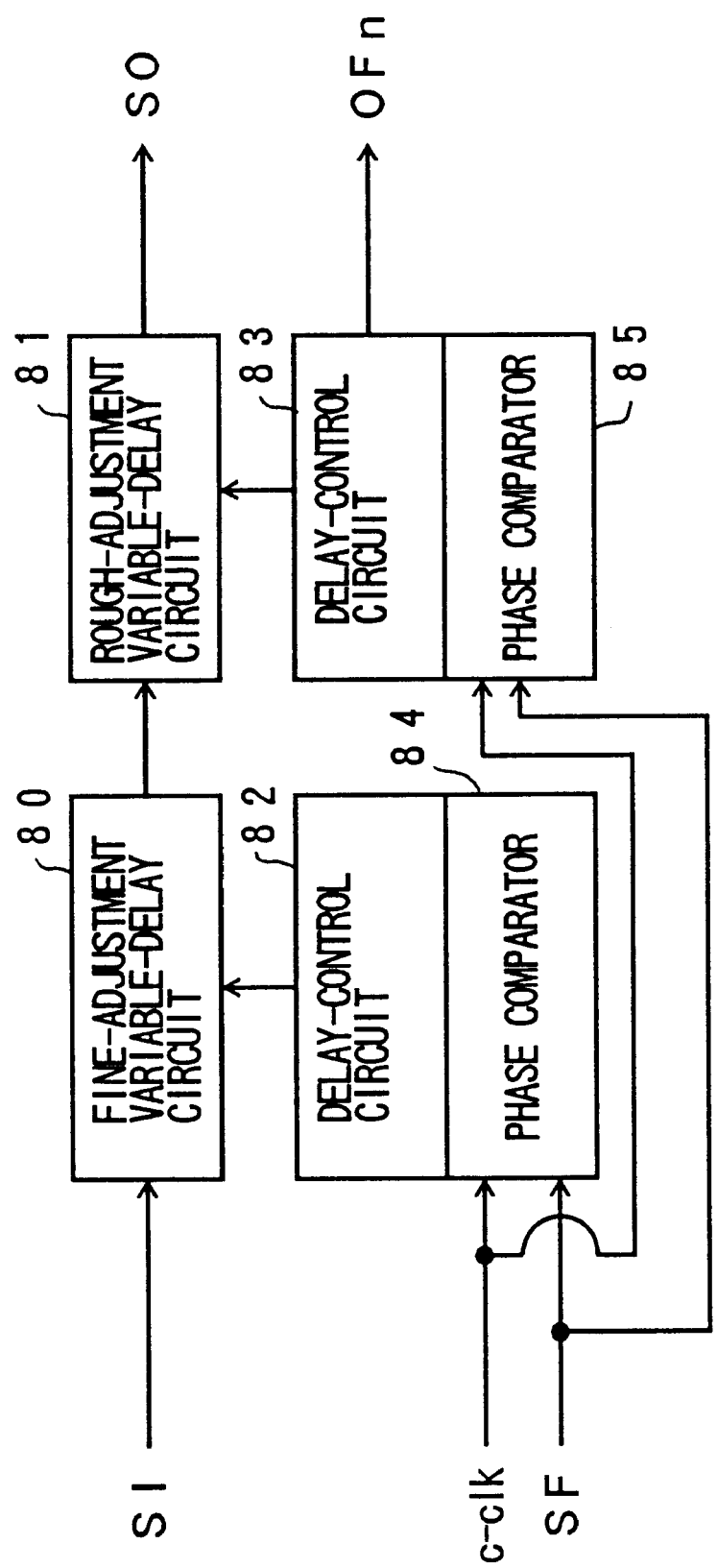
FIG. 18 is a block diagram of a DLL circuit having two stages for a rough-adjustment circuit and a fine-adjustment circuit.

FIG. 18 is a block diagram of a DLL circuit having two stages for a rough-adjustment circuit and a fine-adjustment circuit.

The DLL circuit of FIG. 18 includes a fine-adjustment variable-delay circuit 80, a rough-adjustment variable-delay circuit 81, delay-control circuits 82 and 83, and phase comparators 84 and 85. An input signal SI *e.g., the dummy-clock signal d-clk of FIG. 2) experiences some delay by the fine-adjustment variable-delay circuit 80 and the rough-adjustment variable-delay circuit 81 before being output as an output signal SO. The output signal SO is fed back as a feedback signal SF via dummy circuits or the like, and is compared with the reference-clock signal c-clk in terms of phases thereof. This phase comparison is separately made by the phase comparator 84 and the phase comparator 85 associated with the fine-adjustment variable-delay circuit 80 and the rough-adjustment variable-delay circuit 81, respectively.

The phase comparators 84 and 85 have basically the same structure as the phase comparator shown in FIG. 7. As a miner difference, the phase comparator 84 for a fine phase adjustment needs to have the NAND circuit 135 and the inverter 148 (FIG. 7) having smaller delays compared to those of the phase comparator 85 as these circuit elements define a phase range in which phases are regarded as the same. The rough-adjustment variable-delay circuit 81 and the delay-control circuit 83 are identical to the variable-delay circuit of FIG. 5 and the delay-control circuit of FIG. 6, respectively.

Figure 19:
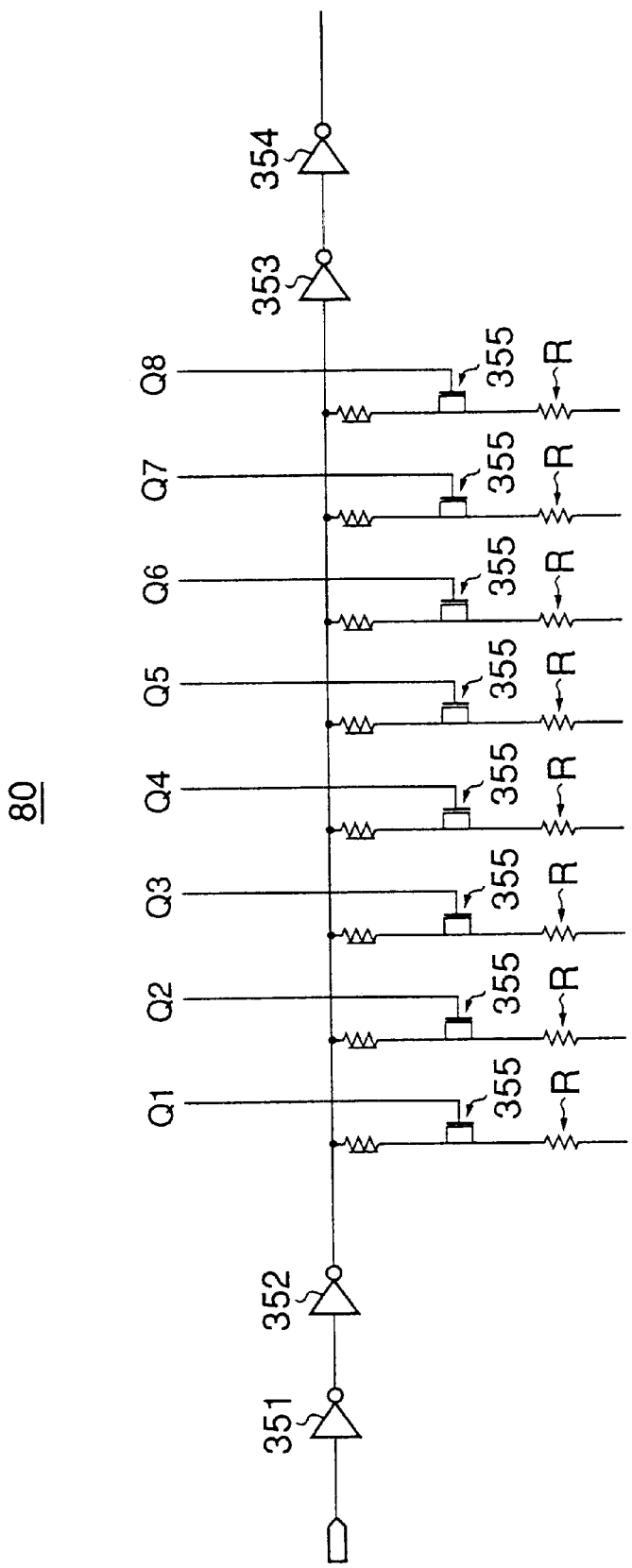
FIG. 19 is a circuit diagram showing a circuit configuration of a fine-adjustment variable-delay circuit of FIG. 18.

FIG. 19 is a circuit diagram showing a circuit configuration of the fine-adjustment variable-delay circuit 80. As shown in FIG. 19, the fine-adjustment variable-delay circuit 80 includes inverters 351 through 354, a plurality of NMOS transistors 355, and a plurality of registers R. Control signals Q1 through Q8 include n HIGH signals and 8-n LOW signals. Since n signals among the control signals Q1 through Q8 are HIGH, n NMOS transistors 355 are turned on between the inverters 352 and 353. This provides additional transistor capacitance commensurate with the n NMOS transistors 355. The additional capacitance slows signal changes when a signal propagates between the inverters 352 and 353, so that it takes a longer time for a signal change to complete. A signal after passing through the inverters 353 and 354 is thus delayed behind a signal before entering the inverters 351 and 352. The amount of delay can be controlled by adjusting the number n of HIGH signals among the control signals Q1 through Q8. The larger the number n, the longer the delay time. The smaller the number n, the shorter the delay time.

The control signals Q1 through Q8 are generated by the delay-control circuit 82 of FIG. 18. As shown in the delay-control circuit of FIG. 6, the control signals Q1 through Q8 can be obtained as outputs of the inverters 122-1 through 122-8.

When the DLL circuit is comprised of two stages having the rough-adjustment circuit and the fine-adjustment circuit as shown in FIG. 18, an overflow signal may be extracted from the delay-control circuit 83 which controls the rough-adjustment variable-delay circuit 81. The reasoning behind this is as follows. Even when the fine-adjustment variable-delay circuit 80 is set to a maximum delay thereof, a delay does not fall short of a desired delay amount as long as the rough-adjustment variable-delay circuit 81 is not set to a maximum delay thereof. Conversely, if the maximum delay is set in the rough-adjustment variable-delay circuit 81, it is fair to assume that a delay is at the maximum end within an adjustable delay range.

An overflow signal is extracted from the delay-control circuit 83 by using the output of the last inverter (122-8) as shown in the delay-control circuit of FIG. 6 when the overflow detector 32 of FIG. 9 is used. When the overflow detector 32 of FIG. 10 is used, on the other hand, the control signal TC8 of the delay-control circuit shown in FIG. 6 is extracted as the overflow signal.

Further, the present invention is not limited to these embodiments, but various variations and modifications may be made without departing from the scope of the present invention.

What is claimed is:

1. A semiconductor device comprising:
    an input buffer buffering an external clock signal to supply an internal clock signal;
    a timing stabilization circuit which generates a plurality of phase-adjusted clock signals by adjusting a timing of said internal clock signal by delaying said internal clock signal by a plurality of variable-delay circuits, each of at least two variable-delay circuits of said plurality of variable delay circuits being controlled separately by a corresponding one of independent delay-control circuits such that the phase-adjusted clock signals have phases independent of each other; and
    an overflow-detection circuit which detects overflow when at least one of said plurality of variable-delay circuits has a delay exceeding the adjustable delay range, said overflow-detection circuit being connected to each of said independent delay-control circuits.

2. The semiconductor device as claimed in claim 1, wherein said overflow-detection circuit detects overflow at an instance when said delay is set to an upper end of said adjustable delay range in said at least one of said plurality of variable-delay circuits or at an instance when said delay is attempted to be increased from said upper end in said at least one of said plurality of variable-delay circuits.

3. The semiconductor device as claimed in claim 1, further comprising an output circuit which outputs an overflow-detection signal to an exterior of said semiconductor device when said overflow-detection circuit detects overflow.

4. A semiconductor device comprising:
    an input buffer buffering an external clock signal to supply an internal clock signal;
    a timing stabilization circuit which generates a plurality of phase-adjusted clock signals by adjusting a timing of said internal clock signal by delaying said internal clock signal by a plurality of variable-delay circuits, each of at least two variable-delay circuits of said plurality of variable delay circuits being controlled separately by a corresponding one of independent delay-control circuits such that the phase-adjusted clock signals have phases independent of each other, wherein said timing-stabilization circuit comprises:
    an overflow-detection circuit which detects overflow when at least one of said plurality of variable-delay circuits has a delay exceeding the adjustable delay range, said overflow-detection circuit being connected to each of said independent delay-control circuits;
    a feedback loop for controlling delays of said plurality of variable-delay circuits; and
    a frequency divider which divides a frequency of said internal clock signal to generate frequency-divided clock signals used in said feedback loop,
    wherein said frequency divider lowers frequencies of said frequency-divided clock signals when said overflow-detection circuit detects.

5. A semiconductor device comprising:
an input buffer buffering an external clock signal to supply an internal clock signal;
a timing stabilization circuit which generates a plurality of phase-adjusted clock signals by adjusting a timing of said internal clock signal by delaying said internal clock signal by a plurality of variable-delay circuits, each of at least two variable-delay circuits of said plurality of variable delay circuits being controlled separately by a corresponding one of independent delay-control circuits such that the phase-adjusted clock signals have phases independent of each other;
an overflow-detection circuit which detects overflow when at least one of said plurality of variable-delay circuits has a delay exceeding the adjustable delay range, the said overflow-detection circuit being connected to each of said independent delay-control circuits, and
a circuit which stops supply of said internal clock signal to said plurality of variable-delay circuits when said overflow-detection circuit detects overflow.

6. A semiconductor device comprising:
an input buffer buffering an external clock signal to supply an internal clock signal;
a timing stabilization circuit which generates a plurality of phase-adjusted clock signals by adjusting a timing of said internal clock signal by delaying said internal clock signal by a plurality of variable-delay circuits, each of at least two variable-delay circuits of said plurality of variable delay circuits being controlled separately by a corresponding one of independent delay-control circuits such that the phase-adjusted clock signals have phases independent of each other; and
an overflow-detection circuit which detects overflow when at least one of said plurality of variable-delay circuits has a delay exceeding the adjustable delay range, the said overflow-detection circuit being connected to each of said independent delay-control circuits, and
selection circuits which supply one of said internal clock signal and an inverse of said internal clock signal to internal circuits as substitutes for said phase-adjusted clock signals serving as synchronization signals in said internal circuits when said overflow-detection circuit detects overflow.

7. A semiconductor device comprising:
an input buffer buffering an external clock signal to supply an internal clock signal;
a timing stabilization circuit which generates a plurality of phase-adjusted clock signals by adjusting a timing of said internal clock signal by delaying said internal clock signal by a plurality of variable-delay circuits, each of at least two variable-delay circuits of said plurality of variable delay circuits being controlled separately by a corresponding one of independent delay-control circuits such that the phase-adjusted clock signals have phases independent of each other;
an overflow-detection circuit which detects overflow when at least one of said plurality of variable-delay circuits has a delay exceeding the adjustable delay range, the said overflow-detection circuit being connected to each of said independent delay-control circuits, and
selection circuits which supply one of said internal clock signal and an inverse of said internal clock signal to internal circuits as substitutes for said phase-adjusted clock signals serving as synchronization signals in said internal circuits when said overflow-detection circuit detects overflow, wherein said selection circuits supply said internal clock signal to said internal circuits in place of said phase-adjusted clock signals that are adjusted to have a phase displacement between 0° and 180° relative to said external clock signal, and supply said inverse of said internal clock signal to said internal circuits in place of said phase-adjusted clock signals that are adjusted to have a phase displacement between 180° and 360° relative to said external clock signal.

8. A semiconductor device comprising:
an input buffer buffering an external clock signal to supply an internal clock signal;
a timing-stabilization circuit which generates a phase-adjusted clock signal by adjusting a timing of said internal clock signal by delaying said internal clock signal by a delay of a variable-delay circuit;
an overflow-detection circuit which generates an overflow-detection signal when said delay of said variable-delay circuit is set to an upper end of an adjustable delay range; and
an output circuit which is connected to said overflow-detection circuit, and outputs said overflow-detection signal to an exterior of said semiconductor device.

9. A semiconductor device comprising:
an input buffer buffering an external clock signal to supply an internal clock signal;
a timing-stabilization circuit which generates a phase-adjusted clock signal by adjusting a delay of a variable-delay circuit as said variable-delay circuit delays said internal clock signal; and
an overflow-detection circuit which detects overflow when said delay of said variable-delay circuit is set to an upper end of an adjustable delay range,
wherein said timing-stabilization circuit comprises:
    a feedback loop for controlling said delay of said variable-delay circuit; and
    a frequency divider which divides a frequency of said internal clock signal to generate a frequency-divided clock signal used in said feedback loop,
    wherein said frequency divider lowers a frequency of said frequency-divided clock signal when said overflow-detection circuit detects overflow.

10. A semiconductor device comprising:

an input buffer buffering an external clock signal to supply an internal clock signal;

a timing-stabilization circuit which generates a phase-adjusted clock signal by adjusting a delay of a variable-delay circuit as said variable-delay circuit delays said internal clock signal;

an overflow-detection circuit which detects overflow when said delay of said variable-delay circuit is set to an upper end of an adjustable delay range; and a circuit which stops supply of said internal clock signal to said variable-delay circuit when said overflow-detection circuit detects overflow.

11. A semiconductor device comprising:

an input buffer buffering an external clock signal to supply an internal clock signal;

a timing-stabilization circuit which generates a phase-adjusted clock signal by adjusting a delay of a rough-adjustment variable-delay circuit and a delay of a fine-adjustment variable-delay circuit as said rough-adjustment variable-delay circuit and said fine-adjustment variable-delay circuit delay said internal clock signal; and an overflow-detection circuit which detects overflow when said delay of said rough-adjustment variable-delay circuit is set to an upper end of an adjustable delay range.

12. A semiconductor device comprising:

an input buffer buffering an external clock signal to supply an internal clock signal;

a timing-stabilization circuit which generates a phase-adjusted clock signal by adjusting a delay of a variable-delay circuit as said variable-delay circuit delays said internal clock signal;

an overflow-detection circuit which detects overflow when said delay of said variable-delay circuit is set to an upper end of an adjustable delay range;

a selection circuit which supplies one of said internal clock signal and an inverse of said internal clock signal to an internal circuit as a substitute for said phase-adjusted clock signal serving as a synchronization signal in said internal circuit when said overflow-detection circuit detects overflow; and a control circuit which overrides operations of said selection circuit based on at least one externally provided signal such that said at least one externally provided signal determines which clock signal is selected by said selection circuit regardless of whether said overflow-detection circuit detects overflow.

13. A semiconductor device receiving an external clock signal, comprising:

a variable-delay circuit receiving the external clock signal for producing a phase-adjusted clock signal to an internal circuit;

a frequency divider receiving the clock signal to generate frequency divided clock signal to a phase comparator which controls a timing of the phase-adjusted clock signal;

an overflow detection circuit detecting an overflow at the variable-delay circuit; and a gate circuit for controlling to supply the clock signal to the variable-delay circuit, wherein the gate circuit prevents to supply the clock signal and the frequency divider increases a dividing ratio, when the overflow-detection circuit detects the overflow.

14. A semiconductor device comprising:

an input buffer buffering an external clock signal to output a first internal clock signal;

a timing adjustment circuit delaying said first internal clock signal to generate a second internal clock signal and including a phase adjusting feedback loop by which a phase of said second internal clock signal is dynamically adjusted to have a predetermined relationship with said external clock signal; and an internal clock selection circuit receiving said first and second internal clock signals and selecting one of said first and second internal clock signals in response to an external input signal that is supplied from an exterior of the device to indicate a choice of one of said first and second internal clock signals, said internal clock selection circuit supplying an internal circuit with selected one of said first and second internal clock signals.

* * * * *